United States Patent
Kim et al.

(10) Patent No.: US 12,456,650 B2
(45) Date of Patent: Oct. 28, 2025

(54) SEMICONDUCTOR DEVICE AND METHOD FOR MANUFACTURING THE SAME

(71) Applicant: SAMSUNG ELECTRONICS CO., LTD., Suwon-si (KR)

(72) Inventors: Kyung Wook Kim, Hwaseong-si (KR); Seung Yong Yoo, Incheon (KR); Eui Bok Lee, Seoul (KR); Jin Nam Kim, Anyang-si (KR); Eun-Ji Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 326 days.

(21) Appl. No.: 17/991,090

(22) Filed: Nov. 21, 2022

(65) Prior Publication Data

US 2023/0282512 A1    Sep. 7, 2023

(30) Foreign Application Priority Data

Jan. 7, 2022    (KR) ........................ 10-2022-0002448

(51) Int. Cl.
*H01L 21/768*    (2006.01)
*H01L 23/535*    (2006.01)

(52) U.S. Cl.
CPC .. *H01L 21/76844* (2013.01); *H01L 21/76846* (2013.01); *H01L 21/76865* (2013.01); *H01L 21/76895* (2013.01); *H01L 23/535* (2013.01)

(58) Field of Classification Search
CPC ......... H01L 21/76844; H01L 21/76846; H01L 21/76865; H01L 21/76895;

(Continued)

(56) References Cited

U.S. PATENT DOCUMENTS 6,841,471 B2 *  1/2005  Park ................. H01L 21/76834
                                                          438/738
7,166,532 B2 *  1/2007  Chun ................ H01L 21/76847
                                                          257/E21.585

(Continued)

FOREIGN PATENT DOCUMENTS

KR    10-2004-0058949 A    7/2004
KR    10-2016-0066899 A    6/2016

OTHER PUBLICATIONS

Communication issued Jun. 12, 2023 by the European Patent Office in European Patent Application No. 22204986.8.

(Continued)

*Primary Examiner* — Dale E Page
*Assistant Examiner* — Quovaunda Jefferson
(74) *Attorney, Agent, or Firm* — Sughrue Mion, PLLC

(57) ABSTRACT

A semiconductor device is provided. The semiconductor device includes: a lower line structure; an upper interlayer insulating film provided on the lower line structure and having a trench formed therein, wherein the trench includes a wiring line trench and a via trench extending from the wiring line trench to the lower line structure; and an upper line structure provided in the line trench, wherein the upper line structure includes an upper barrier film and an upper filling film. The upper filling film includes a first sub-filling film in contact with the upper interlayer insulating film, and a second sub-filling film provided on the first sub-filling film. The first sub-filling film fills an entirety of the upper via trench and covers at least a portion of a bottom surface of the upper wiring line trench.

20 Claims, 36 Drawing Sheets

(58) Field of Classification Search
CPC ......... H01L 21/76847; H01L 21/76879; H01L 21/76807; H01L 21/76849; H01L 21/823475; H01L 21/76877; H01L 23/535; H01L 23/5221; H01L 23/53228; H01L 23/5286; H01L 2221/1063; H01L 29/772; H01L 29/41; H01L 29/66234; H01L 29/66409; H01L 29/66681; H01L 29/66795; H01L 29/6684; H01L 29/73; H01L 29/7816; H01L 29/78391; H01L 29/785; H01L 23/53238; H01L 23/5283; H10D 84/0149; H10D 84/038; H10D 10/00; H10D 10/01; H10D 30/00; H10D 30/01; H10D 30/024; H10D 30/0281; H10D 30/0415; H10D 30/62; H10D 30/65; H10D 64/20

See application file for complete search history.

(56) References Cited

U.S. PATENT DOCUMENTS

| | | |
|---|---|---|
| 7,629,264 B2 | 12/2009 | Bonilla et al. |
| 8,354,751 B2 | 1/2013 | Horak et al. |
| 8,390,124 B2 | 3/2013 | Inoue et al. |
| 9,123,706 B2 * | 9/2015 | Zierath ............. H01L 21/76864 |
| 10,062,647 B2 | 8/2018 | Stamper et al. |
| 10,199,263 B2 * | 2/2019 | Jang .................. H01L 23/53295 |
| 10,453,740 B2 | 10/2019 | Kuo et al. |
| 10,535,559 B2 | 1/2020 | Yang et al. |
| 2008/0054466 A1 | 3/2008 | Nasu et al. |
| 2017/0373000 A1 | 12/2017 | Zhang et al. |
| 2019/0206729 A1 | 7/2019 | Fang et al. |
| 2020/0350201 A1 * | 11/2020 | Motoyama ........ H01L 21/76831 |
| 2021/0057273 A1 | 2/2021 | Chen et al. |
| 2021/0366765 A1 * | 11/2021 | Lu ..................... H01L 21/76844 |

OTHER PUBLICATIONS

Communication issued Jun. 23, 2023 by the European Patent Office in European Patent Application No. 22204986.8.

* cited by examiner

SEMICONDUCTOR DEVICE AND METHOD FOR MANUFACTURING THE SAME

CROSS-REFERENCE TO RELATED APPLICATION

This application claims priority to Korean Patent Application No. 10-2022-0002448, filed on Jan. 7, 2022, in the Korean Intellectual Property Office, the disclosure of which is incorporated by reference herein in its entirety.

BACKGROUND

Field

The present disclosure relates to a semiconductor device and a method for manufacturing the same, and more specifically, to a semiconductor device including a wiring line formed in a Back-End-Of-Line (BEOL) process, and a method for manufacturing the same.

Description of Related Art

Due to rapid progression in down-scaling a semiconductor element, increased integration and reduced power consumption of a semiconductor chip are required. In order to provide the increased integration and reduced power consumption, a feature size of a semiconductor device needs to be decreased.

As the feature size decreases, various studies on a stable connection scheme between lines are being conducted.

SUMMARY

One or more example embodiments provide a semiconductor device capable of improving element performance and reliability.

One or more example embodiments provide a method for manufacturing a semiconductor device that may improve performance and reliability of an element.

According to an aspect of an example embodiment, a semiconductor device includes: a lower line structure; an upper interlayer insulating film provided on the lower line structure and having an upper line trench formed therein, wherein the upper line trench includes an upper wiring line trench and an upper via trench extending from the upper wiring line trench to the lower line structure; and an upper line structure provided in the upper line trench, wherein the upper line structure includes an upper barrier film and an upper filling film. The upper filling film includes a first sub-filling film in contact with the upper interlayer insulating film, and a second sub-filling film provided on the first sub-filling film. The first sub-filling film fills an entirety of the upper via trench and covers at least a portion of a bottom surface of the upper wiring line trench. The upper barrier film is in contact with the upper interlayer insulating film, and is provided between the second sub-filling film and the upper interlayer insulating film.

According to an aspect of an example embodiment, a semiconductor device includes: a lower line structure; an upper interlayer insulating film provided on the lower line structure and having an upper line trench formed therein, wherein the upper line trench includes an upper wiring line trench and an upper via trench extending from the upper wiring line trench to the lower line structure; and an upper line structure is provided in the upper line trench, wherein the upper line structure includes an upper barrier film and an upper filling film. The upper filling film includes a first sub-filling film composed of a single film, and a second sub-filling film provided on the first sub-filling film. The first sub-filling film fills an entirety of the upper via trench and covers at least a portion of a bottom surface of the upper wiring line trench. The upper barrier film extends along and on at least a portion of a sidewall of the upper wiring line trench, and the second sub-filling film is provided between portions of the upper barrier film on an upper surface of the first sub-filling film.

According to an aspect of an example embodiment, a semiconductor device includes: a lower line structure; an upper interlayer insulating film provided on the lower line structure and having an upper line trench formed therein, wherein the upper line trench includes an upper wiring line trench and an upper via trench extending from the upper wiring line trench to the lower line structure; and an upper line structure provided in the upper line trench, wherein the upper line structure includes an upper barrier film, an upper liner, and an upper filling film. The upper filling film includes a first sub-filling film and a second sub-filling film provided on the first sub-filling film. The first sub-filling film is a single film which fills an entirety of the upper via trench and a portion of the upper wiring line trench. The upper barrier film is in contact with the upper interlayer insulating film and extends along and on a portion of a sidewall of the upper wiring line trench. The upper liner is provided between the upper barrier film and the second sub-filling film.

According to an aspect of an example embodiment, there is provided a method for manufacturing a semiconductor device, the method including: forming a lower line structure; forming an upper interlayer insulating film on the lower line structure; forming an upper line trench in the upper interlayer insulating film, the upper line trench including an upper wiring line trench and an upper via trench extending from the upper wiring line trench to the lower line structure; forming a first sub-filling film so as to fill the upper via trench and cover a bottom surface of the upper wiring line trench; forming a selective inhibiting film along an upper surface of the first sub-filling film; forming an upper barrier film along a sidewall of the upper wiring line trench, while the selective inhibiting film is provided on the upper surface of the first sub-filling film; forming an upper liner on the upper barrier film; and forming a second sub-filling film, after the selective inhibiting film is removed, on the upper barrier film.

BRIEF DESCRIPTION OF DRAWINGS

The above and other aspects and features will be more apparent from the following description of example embodiments with reference to the attached drawings, in which.

DETAILED DESCRIPTION

Figure 1:
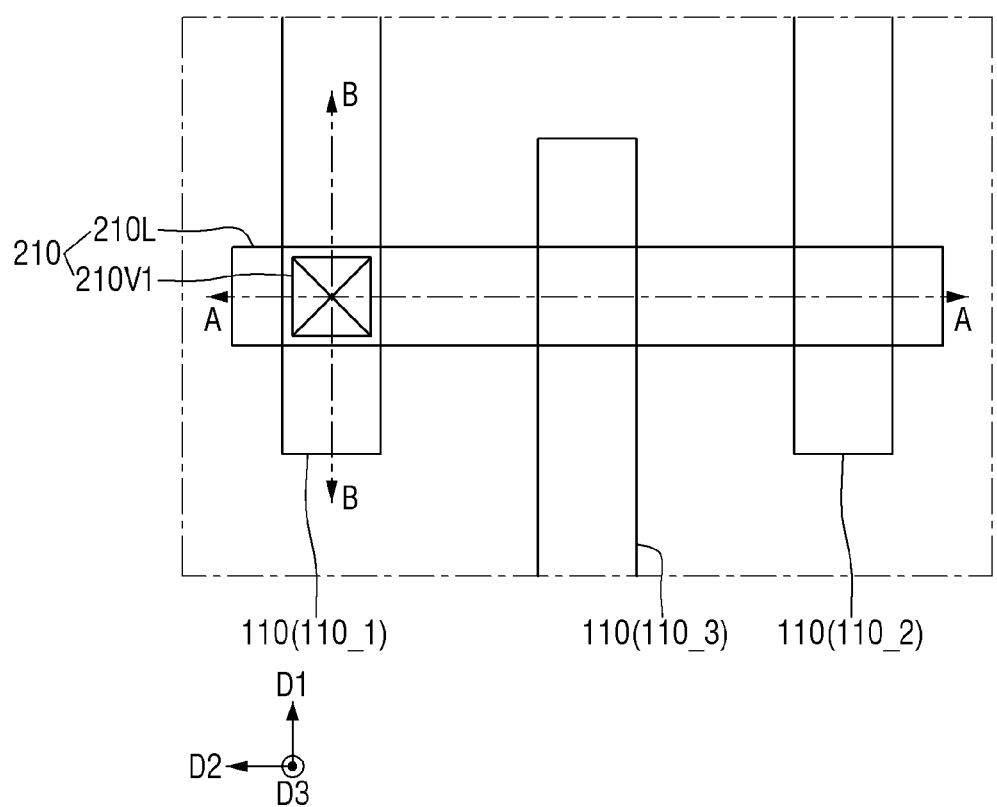
FIG. 1 is an illustrative layout diagram for illustrating a semiconductor device according to some example embodiments.

Hereinafter, example embodiments will be described in detail with reference to the accompanying drawings. For simplicity and clarity of illustration, elements in the drawings are not necessarily drawn to scale. The same reference numbers in different drawings represent the same or similar elements. Further, descriptions and details of well-known operations and elements are omitted for simplicity of the description. Furthermore, in the following detailed description, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Aspects of various example embodiments are illustrated and described further below. It will be understood that the description herein is not intended to limit the claims to the specific example embodiments described. On the contrary, it is intended to cover alternatives, modifications, and equivalents as may be included within the spirit and scope of the present disclosure.

A shape, a size, a ratio, an angle, a number, etc., disclosed in the drawings for illustrating an example embodiments of the present disclosure are illustrative, and the present disclosure is not limited thereto. The same reference numerals refer to the same elements herein. Further, descriptions and details of well-known operations and elements are omitted for simplicity of the description. Furthermore, in the following detailed description, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular example embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of at least one of the associated listed items. Expression such as "at least one of" when preceding a list of elements may modify the entirety of list of elements and may not modify the individual elements of the list. For example, the expression, "at least one of a, b, and c," should be understood as including only a, only b, only c, both a and b, both a and c, both b and c, or all of a, b, and c. When referring to "C to D", this indicates C inclusive to D inclusive unless otherwise specified. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Unless otherwise defined, all terms including technical and scientific terms used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain example embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated. The features of the various example embodiments of the present disclosure may be partially or entirely combined with each other, and may be technically associated with each other or operate with each other. The example embodiments may be implemented independently of each other and may be implemented together in an association relationship.

In the drawings related to the semiconductor device according to some example embodiments, by way of example, a fin-type transistor (FinFET) including a fin-type pattern shaped channel area, a transistor including a nanowire or a nanosheet, a Multi-Bridge Channel Field Effect Transistor (MBCFET™) or a vertical transistor (Vertical FET) is shown. The present disclosure is not limited thereto. In another example, a semiconductor device according to some example embodiments may include a tunneling transistor (tunneling FET), or a 3D transistor. In another example, a semiconductor device according to some example embodiments may include a planar transistor. In addition, the technical idea of the present disclosure may be applied to a transistor based on 2D material (a 2D material based FET) and a heterostructure thereof.

Further, a semiconductor device according to some example embodiments may include a bipolar junction transistor, a lateral double diffusion transistor (LDMOS), and the like.

Figure 2:
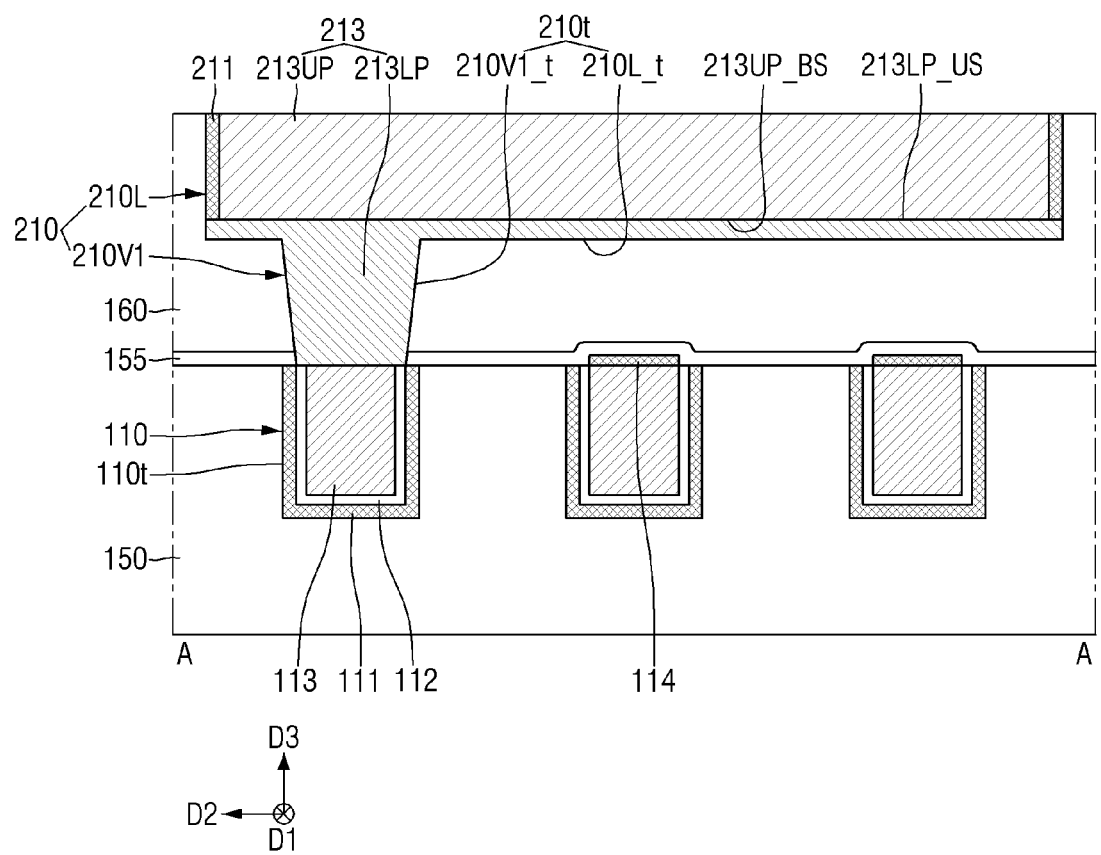
FIG. 2 is an illustrative cross-sectional view taken along A-A of FIG. 1.
Figure 3:
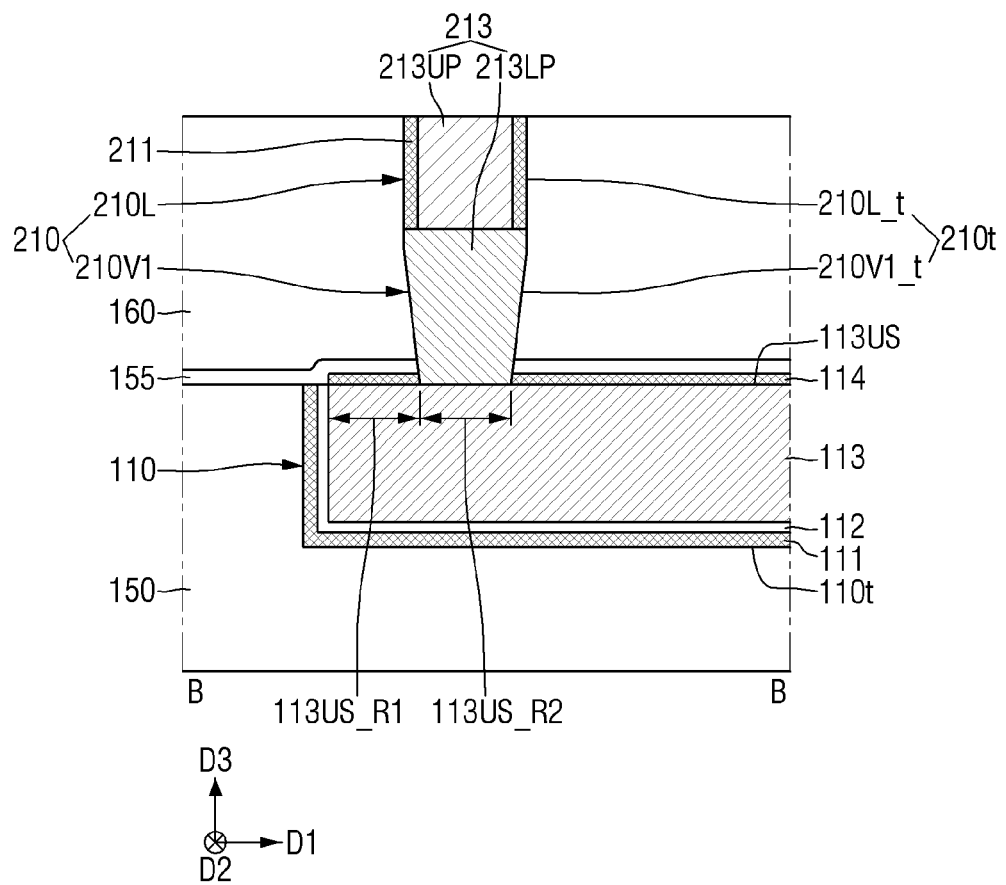
FIG. 3 is an illustrative cross-sectional view taken along B-B of FIG. 1.

FIG. 1 is an illustrative layout diagram for illustrating a semiconductor device according to some example embodiments. FIG. 2 is an illustrative cross-sectional view taken along A-A of FIG. 1. FIG. 3 is an illustrative cross-sectional view taken along B-B of FIG. 1.

Referring to FIG. 1 to FIG. 3, a semiconductor device according to some example embodiments may include a lower line structure 110 and a first upper line structure 210.

The lower line structure 110 may be disposed in a first interlayer insulating film 150. The lower line structure 110 may extend in an elongated manner in a first direction D1.

The lower line structure 110 may have a line shape extending in the first direction D1. For example, the first direction D1 may be a length direction of the lower line structure 110, and a second direction D2 may be a width direction of the lower line structure 110. In this regard, the first direction D1 intersects the second direction D2 and a third direction D3. The second direction D2 intersects the third direction D3.

The first interlayer insulating film 150 may cover a gate electrode and a source/drain of a transistor formed in a front-end-of-line (FEOL) process. Alternatively, the first interlayer insulating film 150 may be an interlayer insulating film formed in a Back-end-of-Line (BEOL) process.

In one example, the lower line structure 110 may be a contact or a contact line formed in a Middle-of-Line (MOL) process. In another example, the lower line structure 110 may be a connection line formed in the BEOL process. Below, an example in which the lower line structure 110 is embodied as the connection line formed in the BEOL process is described.

The first interlayer insulating film 150 may include, for example, at least one of silicon oxide, silicon nitride, silicon oxynitride, and a low dielectric constant material. The low dielectric constant material may be, for example, silicon oxide with moderately high carbon and hydrogen contents, and may be a material such as SiCOH. Because carbon is included in the insulating material, a dielectric constant of the insulating material may be lowered. However, in order to further lower the dielectric constant of the insulating material, the insulating material may include pores such as gas-filled or air-filled cavities in the insulating material.

The low-k materials may include, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica, or a combination thereof. However, the present disclosure is not limited thereto.

The lower line structure 110 may be disposed at a first metal level. The first interlayer insulating film 150 may include a lower line trench 110t extending in an elongated manner in the first direction D1.

The lower line structure 110 may include, for example, first to third lower line structures 110_1, 110_2, and 110_3. The first to third lower line structures 110_1, 110_2, and 110_3 may be spaced apart from each other along the second direction D2. For example, the third lower line structure 110_3 may be disposed between the first lower line structure 110_1 and the second lower line structure 110_2.

The lower line structure 110 may be disposed in the lower line trench 110t. The lower line structure 110 may fill the lower line trench 110t.

The lower line structure 110 may include a lower barrier film 111, a lower liner 112, a lower filling film 113, and a lower capping film 114. The lower liner 112 may be disposed between the lower barrier film 111 and the lower filling film 113. The lower capping film 114 may be disposed on the lower filling film 113.

The lower barrier film 111 may extend along and on a sidewall and a bottom surface of the lower line trench 110t. The lower liner 112 may be disposed on the lower barrier film 111. The lower liner 112 may extend along and on a sidewall and a bottom surface of the lower line trench 110t while being disposed on the lower barrier film 111.

The lower filling film 113 may be disposed on the lower liner 112. The lower filling film 113 may fill the rest of the lower line trench 110t.

The lower capping film 114 may extend along and on an upper surface 113US of the lower filling film. The lower capping film 114 may be disposed on an upper surface of the lower liner 112.

For example, the lower capping film 114 may not be disposed on at least a portion of an upper surface of the lower liner 112. As another example, the lower capping film 114 may cover at least a portion of an upper surface of the lower liner 112.

For example, the lower capping film 114 may not cover an upper surface of the lower barrier film 111. As another example, the lower capping film 114 may cover at least a portion of an upper surface of the lower barrier film 111.

An upper surface of the lower liner 112 is shown to be coplanar with the upper surface 113US of the lower filling film and an upper surface of the lower barrier film 111. However, the present disclosure is not limited thereto. In this regard, the upper surface of the lower liner 112 may indicate a topmost surface of a portion of the lower liner 112 extending along and on a sidewall of the lower line trench 110t.

The lower barrier film 111 may include, for example, at least one of tantalum (Ta), tantalum nitride (TaN), tantalum nitride (TaN:Ru) doped with ruthenium (Ru), titanium (Ti), titanium Nitride (TiN), titanium Silicon Nitride (TiSiN), tungsten Nitride (WN), tungsten carbonitride (WCN), zirconium (Zr), zirconium Nitride (ZrN), vanadium (V), vanadium nitride (VN), niobium (Nb), niobium Nitride (NbN), platinum (Pt), iridium (Ir) and rhodium (Rh). Below, an example in which the lower barrier film 111 includes one of tantalum nitride (TaN) or ruthenium (Ru)-doped tantalum nitride (TaN:Ru) is described.

The lower liner 112 may include a conductive material, for example, a metal or a metal alloy. The lower liner 112 may include, for example, at least one of ruthenium (Ru), cobalt (Co), and a ruthenium-cobalt (RuCo) alloy. However, the present disclosure is not limited thereto.

The lower filling film 113 may include a conductive material, for example, at least one of aluminum (Al), copper (Cu), tungsten (W), cobalt (Co), ruthenium (Ru), silver (Ag), gold (Au), manganese (Mn), molybdenum (Mo), rhodium (Rh), iridium (Ir), RuAl, NiAl, $NbB_2$, $MoB_2$, $TaB_2$, $V_2AlC$, and CrAlC. In the semiconductor device according to some example embodiments, the lower filling film 113 may include copper (Cu).

The lower capping film 114 may include a conductive material, for example, a metal. The lower capping film 114 may include, for example, at least one of cobalt (Co), ruthenium (Ru), and manganese (Mn). In the semiconductor device according to some example embodiments, the lower capping film 114 may include cobalt. The lower capping film 114 may be made of cobalt (Co).

As another example, the lower line structure 110 may have a single film structure. Also, a via pattern connecting a conductive pattern disposed under the lower line structure 110 thereto may be further included in the device.

As an example, the lower line structure 110 may not include the lower liner 112. The lower filling film 113 may be disposed directly on the lower barrier film 111.

The lower line structure 110 may be formed using, for example, a damascene scheme. In FIG. 2, a width in the second direction D2 of the lower line structure 110 is shown to be constant. However, the present disclosure is not limited thereto. For example, a width of the lower line structure 110 in the second direction D2 may decrease as it extends away from an upper surface of the first interlayer insulating film 150.

A first etch stop film 155 may be disposed on the lower line structure 110 and the first interlayer insulating film 150. A second interlayer insulating film 160 may be disposed on the first etch stop film 155. The first etch stop film 155 may be disposed between the first interlayer insulating film 150 and the second interlayer insulating film 160.

The second interlayer insulating film 160 may include a first upper line trench 210*t*. The first upper line trench 210*t* may extend through the first etch stop film 155.

The first upper line trench 210*t* may expose a portion of the lower line structure 110. For example, the first upper line trench 210*t* may expose a portion of the first lower line structure 110_1.

The first upper line trench 210*t* may include a first upper via trench **210V1_*t* and a first upper line trench 210L_t. The first upper line trench 210L_t may extend in the second direction D2. The first upper wiring line trench 210L_t may extend to an upper surface of the second interlayer insulating film 160. The first upper via trench 210V1_*t* may be formed on a bottom surface of the first upper wiring line trench 210L_t**.

For example, the bottom surface of the first upper line trench 210*t* may be a bottom surface of the first upper via trench **210V1_*t*. The bottom surface of the first upper line trench 210***t* may be defined by the lower line structure 110. For example, the bottom surface of the first upper via trench **210V1_*t* may be defined by the first lower line structure 110_1**.

A sidewall of the first upper line trench 210*t* may include a sidewall and a bottom surface of the first upper line trench 210L_t, and a sidewall of the first upper via trench **210V1_*t*. The sidewall and the bottom surface of the first upper wiring line trench 210L_t may be defined by the second interlayer insulating film 160. The sidewall of the first upper via trench 210V1_*t* may be defined by the second interlayer insulating film 160 and the first etch stop film 155**.

In the semiconductor device according to some example embodiments, the first upper line trench 210*t* may extend through the lower capping film 114. The first upper line trench 210*t* may expose a portion of the upper surface 113US of the lower filling film. In this case, a portion of a sidewall of the first upper via trench **210V1_*t* may be defined by the lower capping film 114. The bottom surface of the first upper line trench 210***t* may be defined by the upper surface 113US of the lower filling film.

The second interlayer insulating film 160 may include, for example, at least one of silicon oxide, silicon nitride, silicon oxynitride, and a low dielectric constant material.

The first etch stop film 155 may include a material having an etch selectivity with respect to the second interlayer insulating film 160. The first etch stop film 155 may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), aluminum oxide (AlO), aluminum nitride (AlN), aluminum oxycarbide (AlOC), and combinations thereof.

Although the first etch stop film 155 is illustrated as a single film, this is only an example and the disclosure is not limited thereto. In another example, the first etch stop film 155 may include a plurality of insulating films sequentially stacked on the first interlayer insulating film 150.

The first upper line structure 210 may be disposed in the first upper line trench 210*t*. The first upper line structure 210 may fill the first upper line trench 210*t*. The first upper line structure 210 may be disposed in the second interlayer insulating film 160.

The first upper line structure 210 may be disposed on the lower line structure 110. The first upper line structure 210 may be connected to the lower line structure 110. The first upper line structure 210 may be in contact with the lower line structure 110. For example, the first upper line structure 210 may be connected to the first lower line structure 110_1.

The first upper line structure 210 may include a first upper wiring line 210L and a first upper via 210V1. The first upper via 210V1 may connect the first upper wiring line 210L and the lower line structure 110 to each other. The first upper via 210V1 may be in contact with the lower line structure 110. For example, the first upper via 210V1 may connect the first upper wiring line 210L and the first lower line structure 110_1 to each other.

In the semiconductor device according to some example embodiments, the upper surface 113US of the lower filling film may include a first area 113US_R1 not in contact with the first upper line structure 210, and a second area 113US_R2 in contact with the first upper line structure 210. The first upper via 210V1 may be in contact with the second area 113US_R2 of the upper surface of the lower filling film.

For example, the lower capping film 114 may be disposed on the first area 113US_R1 of the upper surface of the lower filling film. The lower capping film 114 may cover the first area 113US_R1 of the upper surface of the lower filling film. The lower capping film 114 may be not disposed on the second area 113US_R2 of the upper surface of the lower filling film. The lower capping film 114 may not cover the second area 113US_R2 of the upper surface of the lower filling film.

When a portion of the lower capping film 114 is etched to expose the second area 113US_R2 of the upper surface of the lower filling film, the lower filling film 113 may not be removed by the etching process. The first area 113US_R1 of the upper surface of the lower filling film may be coplanar with the second area 113US_R2 of the upper surface of the lower filling film. However, the present disclosure is not limited thereto.

The first upper line structure 210 may fill the first upper via trench 210V1_t and the first upper line trench 210L_t. The first upper wiring line 210L may be disposed in the first upper wiring line trench 210L_t. The first upper via 210V1 may be disposed in the first upper via trench 210V1_t.

The first upper wiring line 210L may be disposed at a second metal level which is different from the first metal level. The first upper wiring line 210L may be disposed at the second metal level higher than the first metal level.

The first upper line structure 210 may include a first upper barrier film 211 and a first upper filling film 213. Additionally, the first upper line structure 210 may include an upper capping film such as the lower capping film 114.

The first upper filling film 213 may include a first sub-filling film 213LP and a second sub-filling film 213UP. The second sub-filling film 213UP may be disposed on the first sub-filling film 213LP between the first upper barrier film 211.

In the semiconductor device according to some example embodiments, the second sub-filling film 213UP may be in contact with the first sub-filling film 213LP. A bottom surface 213UP_BS of the second sub-filling film may be in contact with an upper surface 213LP_US of the first sub-filling film.

The first sub-filling film 213LP may fill an entirety of the first upper via trench 210V1_t. For example, only the first sub-filling film 213LP may be disposed in the first upper via trench 210V1_t.

The first sub-filling film 213LP may be in contact with the second interlayer insulating film 160. More specifically, the first sub-filling film 213LP may be in contact with the second interlayer insulating film 160 defining a sidewall of the first upper via trench 210V1_t.

The first sub-filling film 213LP may fill a portion of the first upper wiring line trench 210L_t. The first sub-filling film 213LP may cover at least a portion of a bottom surface of the first upper wiring line trench 210L_t. The first sub-filling film 213LP may be in contact with the second interlayer insulating film 160 defining a bottom surface of the first upper wiring line trench 210L_t.

In the semiconductor device according to some example embodiments, the first sub-filling film 213LP may cover an entirety of a bottom surface of the first upper wiring line trench 210L_t. For example, the first sub-filling film 213LP may cover a portion of a sidewall of the first upper wiring line trench 210L_t.

The first sub-filling film 213LP may be formed as a single film. In this regard, "single film" may indicate being made of a single conductive material. However, the first sub-filling film 213LP formed as a single film may include an impurity that is unintentionally introduced in the process of forming the first sub-filling film 213LP.

The first upper via 210V1 may include only the first sub-filling film 213LP. The first upper via 210V1 may be formed as a single film.

The second sub-filling film 213UP may fill the remainder of the first upper wiring line trench 210L_t remaining after the first sub-filling film 213LP is provided therein.

The first sub-filling film 213LP may include, for example, a conductive material capable of selective growth. The first sub-filling film 213LP may include, for example, one of titanium (Ti), tungsten (W), molybdenum (Mo), ruthenium (Ru) and cobalt (Co).

The first sub-filling film 213LP may include a different material from that of the second sub-filling film 213UP. The second sub-filling film 213UP may include, for example, at least one of aluminum (Al), copper (Cu), silver (Ag), gold (Au), manganese (Mn), rhodium (Rh), iridium (Ir), RuAl, NiAl, $NbB_2$, $MoB_2$, $TaB_2$, $V_2AlC$ and CrAlC.

In the semiconductor device according to some example embodiments, the second sub-filling film 213UP may include copper (Cu).

The first upper bather film 211 may extend along and on at least a portion of a sidewall of the first upper wiring line trench 210L_t. The first upper barrier film 211 may cover at least a portion of a sidewall of the first upper wiring line trench 210L_t.

For example, the first upper barrier film 211 may extend along and on a portion of a sidewall of the first upper wiring line trench 210L_t. For example, the first upper barrier film 211 may contact an upper surface 213LP_US of the first sub-filling film.

The first upper barrier film 211 may be disposed between the second sub-filling film 213UP and the second interlayer insulating film 160. The first upper barrier film 211 may be in contact with the second interlayer insulating film 160. The first upper barrier film 211 may be in contact with the second interlayer insulating film 160 defining a sidewall of the first upper wiring line trench 210L_t.

The first upper barrier film 211 may not extend along and on the upper surface 213LP_US of the first sub-filling film. For example, the first upper barrier film 211 may not be disposed along and on a boundary between the upper surface 213LP_US of the first sub-filling film and a bottom surface 213UP_BS of the second sub-filling film. The first upper barrier film 211 may not be disposed between the upper surface 213LP_US of the first sub-filling film and the bottom surface 213UP_BS of the second sub-filling film, such that an increase in resistance between the second sub-filling film 213UP and the first sub-filling film 213LP due to the first upper barrier film 211 may be prevented.

In the semiconductor device according to some example embodiments, the first upper barrier film 211 may not extend along and on a bottom surface of the first upper wiring line trench 210L_t. The first upper barrier film 211 may not contact the second interlayer insulating film 160 that defines a bottom surface of the first upper wiring line trench 210L_t.

The first upper barrier film 211 may include, for example, at least one of tantalum (Ta), tantalum nitride (TaN), tantalum nitride (TaN:Ru) doped with ruthenium (Ru), titanium (Ti), titanium Nitride (TiN), titanium Silicon Nitride (TiSiN), tungsten Nitride (WN), tungsten carbonitride (WCN), zirconium (Zr), zirconium Nitride (ZrN), vanadium (V), vanadium nitride (VN), niobium (Nb), niobium Nitride (NbN), platinum (Pt), iridium (Ir) and rhodium (Rh). Below, an example in which the first upper bather film 211 includes one of tantalum nitride (TaN) or ruthenium (Ru)-doped tantalum nitride (TaN:Ru) is described.

As another example, the lower line structure 110 may include the lower filling film 113 composed of a double film as in the first upper line structure 210. In this case, the lower barrier film 111 does not extend along and on a bottom surface of the lower line trench 110t. The lower barrier film 111 may extend along and on at least a portion of a sidewall of the lower line trench 110t.

Figure 4:
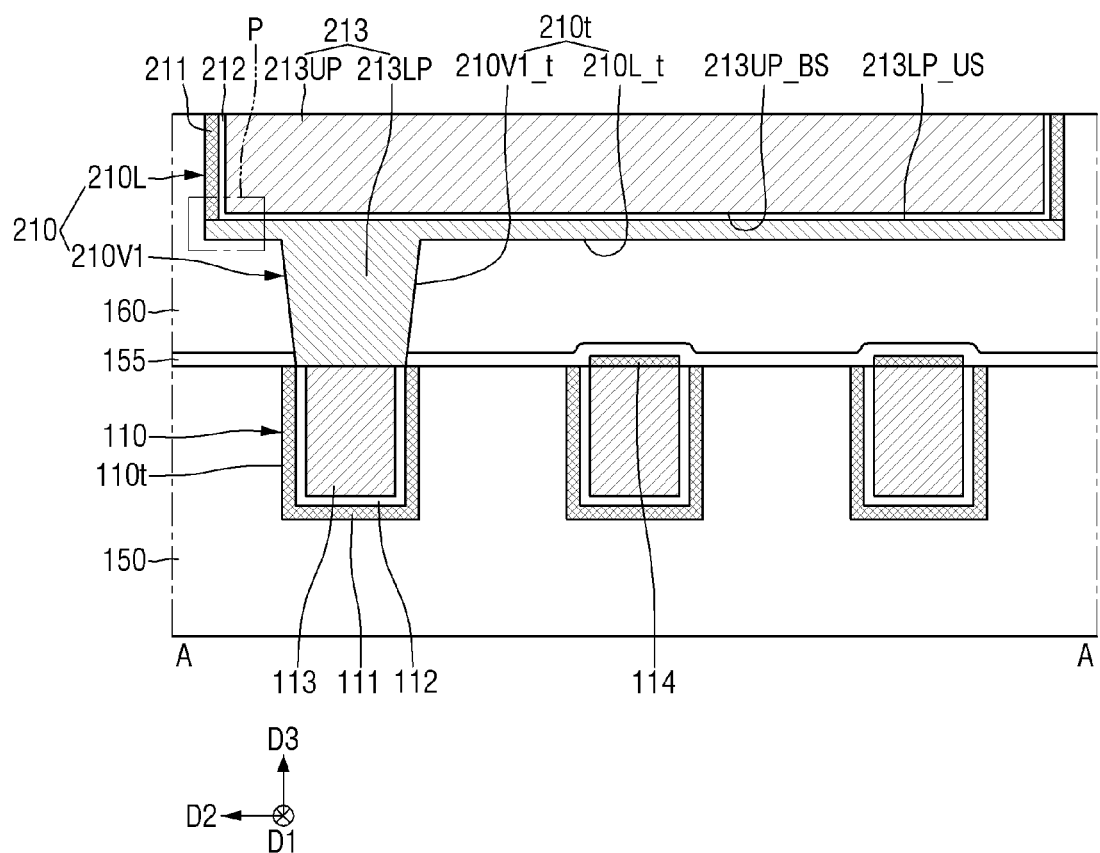
FIG. 4 to FIG. 6 are diagrams for illustrating a semiconductor device according to some example embodiments.
Figure 5:
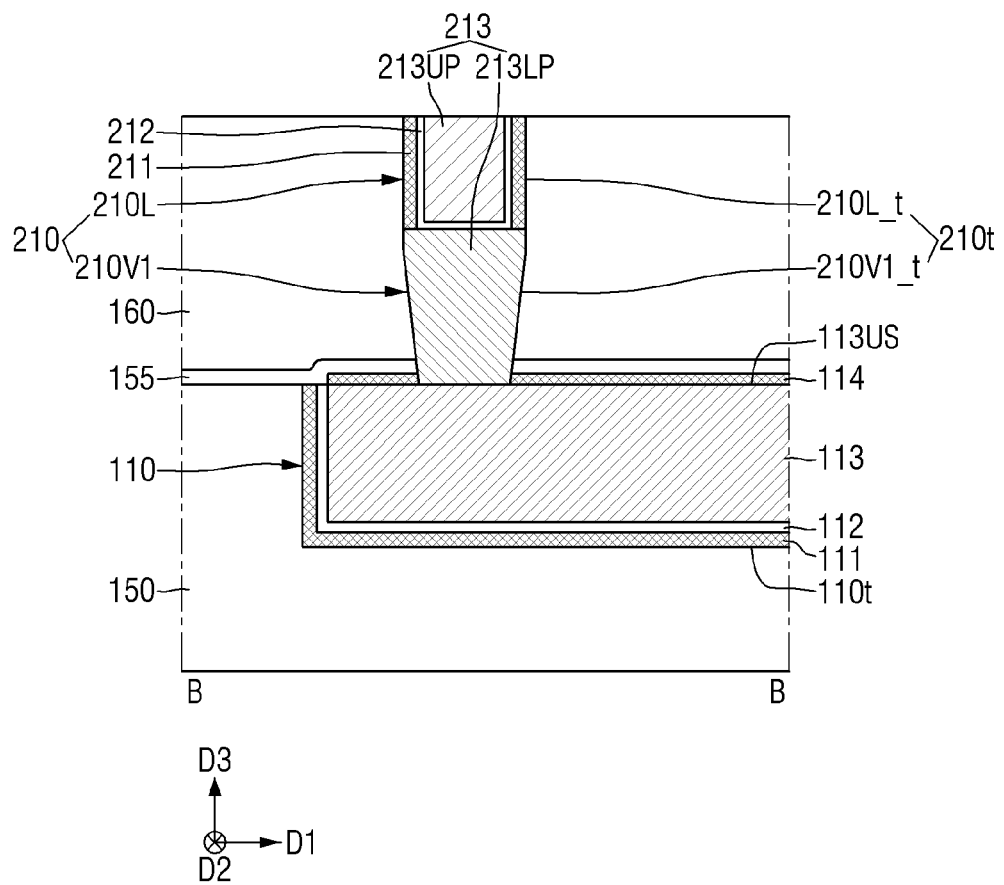
Figure 6:
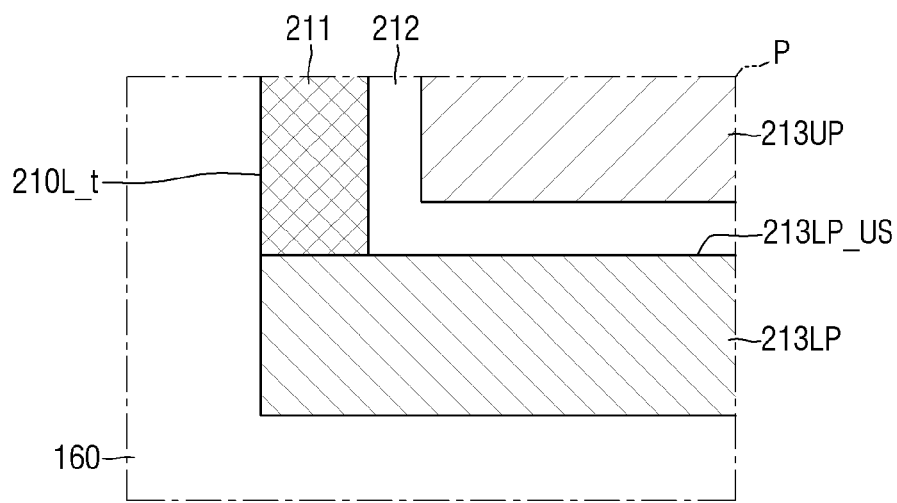

FIG. 4 to FIG. 6 are diagrams for illustrating a semiconductor device according to some example embodiments. The following description is based on differences thereof from those as described with reference to FIG. 1 to FIG. 3.

For reference, FIGS. 4 and 5 are illustrative cross-sectional views taken along A-A and B-B of FIG. 1. FIG. 6 is an enlarged view of a P portion of FIG. 4.

Referring to FIG. 4 to FIG. 6, in the semiconductor device according to some example embodiments, the first upper line structure 210 may further include a first upper liner 212.

The first upper liner 212 may be disposed between the first upper barrier film 211 and the second sub-filling film 213UP, and between the first sub-filling film 213LP and the second sub-filling film 213UP.

The first upper liner 212 may extend along and on a boundary between the first upper barrier film 211 and the second sub-filling film 213UP. The first upper liner 212 may extend along and on a boundary between an upper surface 213LP_US of the first sub-filling film and a bottom surface 213UP_BS of the second sub-filling film.

For example, the first upper liner 212 may extend along and on a bottom surface 213UP_BS of the second sub-filling film and a sidewall of the second sub-filling film 213UP. Because the first upper liner 212 may be disposed on the first sub-filling film 213LP and the second sub-filling film 213UP, the first sub-filling film 213LP may not come into contact with the second sub-filling film 213UP. The sidewall of the second sub-filling film 213UP may face the first upper barrier film 211 extending in the third direction D3.

The first upper liner 212 may be in contact with the first upper barrier film 211, the first sub-filling film 213LP, and the second sub-filling film 213UP.

The first upper liner 212 may include, for example, at least one of ruthenium (Ru) and cobalt (Co). For example, the first upper liner 212 may include one of a ruthenium film, a cobalt film, and a ruthenium-cobalt (RuCo) alloy film. In this regard, "ruthenium-cobalt alloy film" may be a film made purely of ruthenium and cobalt, or may be a film including an impurity introduced in a process of forming the alloy film.

However, the technical idea of the present disclosure is not limited due to the above-described material included in the first upper liner 212.

Figure 7:
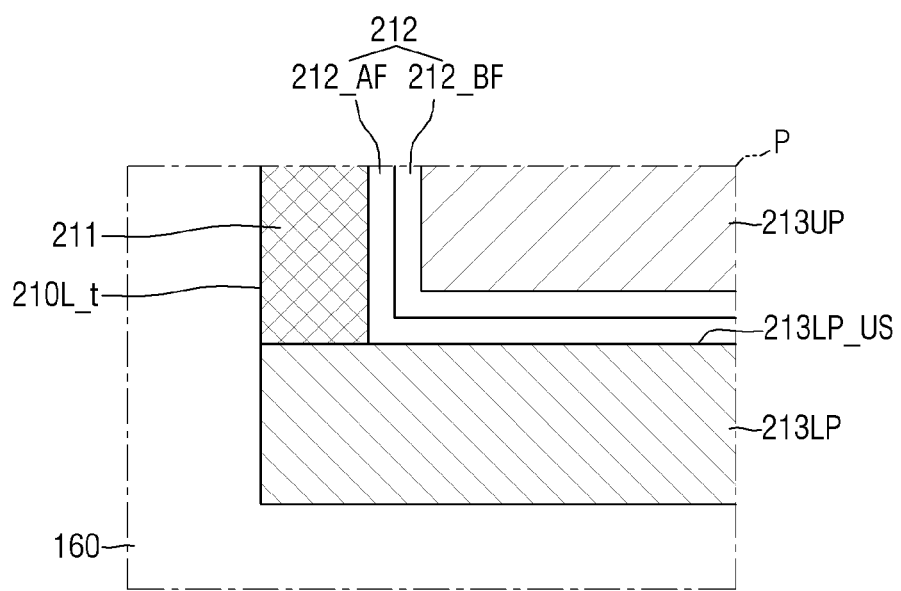
FIG. 7 is a diagram for illustrating a semiconductor device according to some example embodiments.

FIG. 7 is a diagram for illustrating a semiconductor device according to some example embodiments. The following description is based on differences thereof from the description with reference to FIG. 4 to FIG. 6. For reference, FIG. 7 is an enlarged view of the P portion of FIG. 4.

Referring to FIG. 7, in the semiconductor device according to some example embodiments, the first upper liner 212 may include a first sub-liner 212_AF and a second sub-liner 212_BF sequentially disposed on the first upper barrier film 211.

The second sub-liner 212_BF may be disposed on the first sub-liner 212_AF. Each of the first sub-liner 212_AF and the second sub-liner 212_BF may extend along and on a bottom surface 213UP_BS of the second sub-filling film and a sidewall of the second sub-filling film 213UP.

The first sub-liner 212_AF may be in contact with the first sub-filling film 213LP. The second sub-liner 212_BF may be in contact with the second sub-filling film 213UP.

Each of the first sub-liner 212_AF and the second sub-liner 212_BF may include one of a ruthenium film, a cobalt film, and a ruthenium-cobalt (RuCo) alloy film.

Figure 8:
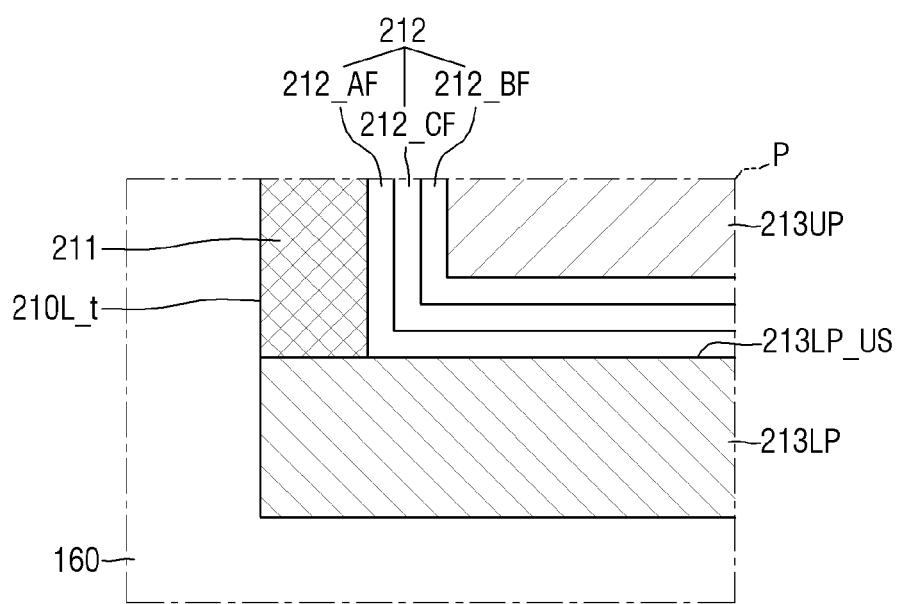
FIG. 8 is a diagram for illustrating a semiconductor device according to some example embodiments.

FIG. 8 is a diagram for illustrating a semiconductor device according to some example embodiments. The following description is based on differences thereof from the description with reference to FIG. 7. For reference, FIG. 8 is an enlarged view of the P portion of FIG. 4.

Referring to FIG. 8, in the semiconductor device according to some example embodiments, the first upper liner 212 may include a third sub-liner 212_CF disposed between the first sub-liner 212_AF and the second sub-liner 212_BF.

The third sub-liner 212_CF may extend along and on a bottom surface 213UP_BS of the second sub-filling film and a sidewall of the second sub-filling film 213UP.

One of the first sub-liner 212_AF and the second sub-liner 212_BF may include a ruthenium film, while the other one of the first sub-liner 212_AF and the second sub-liner 212_BF may include a cobalt film. The third sub-liner 212_CF may include a ruthenium-cobalt (RuCo) alloy film.

Figure 9:
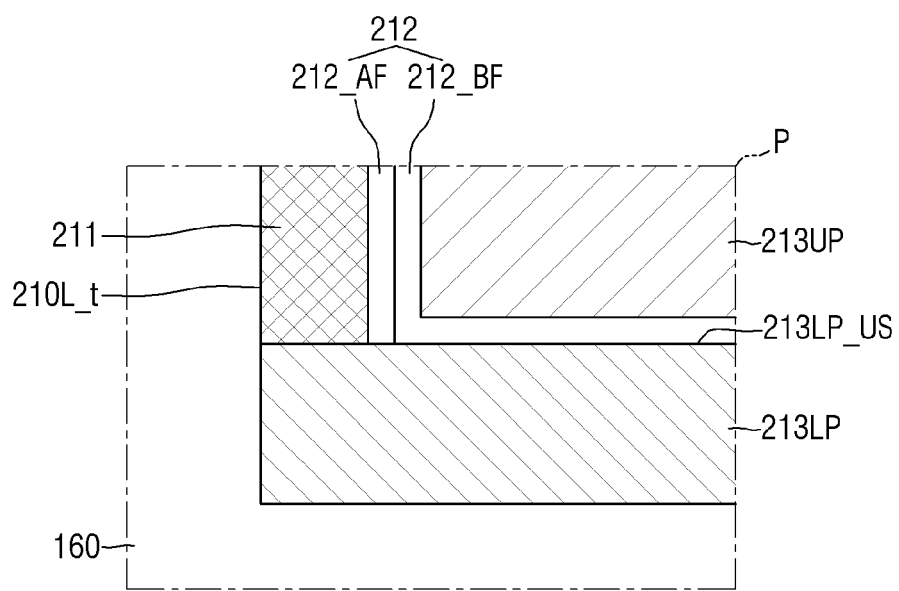
FIGS. 9 to 11 are diagrams for illustrating semiconductor devices according to some example embodiments, respectively.
Figure 10:
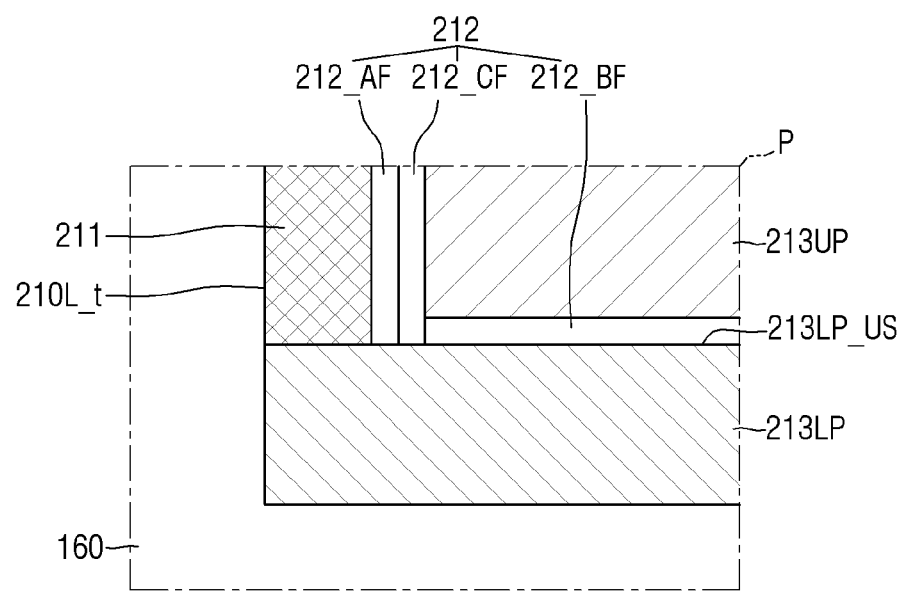
Figure 11:
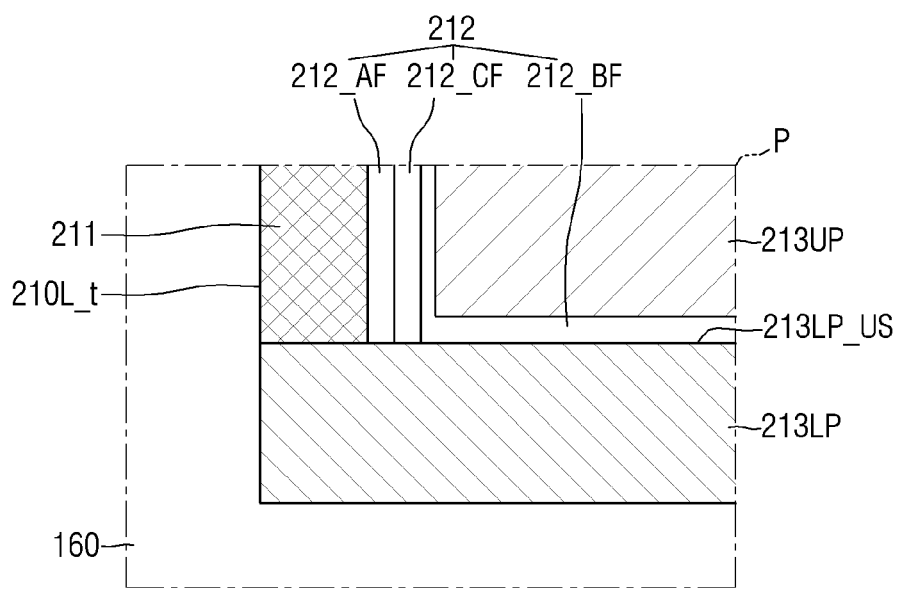

FIGS. 9 to 11 are diagrams for illustrating semiconductor devices according to some example embodiments, respectively. The following description is based on differences from the description with reference to FIGS. 7 and 8. For reference, FIG. 9 to FIG. 11 are enlarged views of the P portion of FIG. 4.

In the following description, the third sub-liner 212_CF may be embodied as a ruthenium-cobalt (RuCo) alloy film. In one example, the first sub-liner 212_AF may include a ruthenium film, and the second sub-liner 212_BF may include a cobalt film. In another example, the first sub-liner 212_AF may include a cobalt layer, and the second sub-liner 212_BF may include a ruthenium layer.

Referring to FIG. 9, in the semiconductor device according to some example embodiments, the first upper liner 212 may include the first sub-liner 212_AF and the second sub-liner 212_BF.

The first sub-liner 212_AF may extend along and on a sidewall of the second sub-filling film 213UP. The first sub-liner 212_AF may not extend along and on a bottom surface 213UP_BS of the second sub-filling film.

The second sub-liner 212_BF may extend along and on a bottom surface 213UP_BS of the second sub-filling film and a sidewall of the second sub-filling film 213UP.

As another example, the third sub-liner 212_CF in place of the first sub-liner 212_AF may be disposed at a location where the first sub-liner 212_AF is disposed. That is, the first upper liner 212 may include the second sub-liner 212_BF, and the third sub-liner 212_CF may be disposed between the first sub-liner 212_AF and the second sub-liner 212_BF, but not extend along and on a bottom surface 213UP_BS of the second sub-filling film.

Referring to FIGS. 10 and 11, in the semiconductor device according to some example embodiments, the first upper liner 212 may include the first sub-liner 212_AF, the second sub-liner 212_BF, and the third sub-liner 212_CF.

Each of the first sub-liner 212_AF and the third sub-liner 212_CF may extend along and on a sidewall of the second sub-filling film 213UP. Each of the first sub-liner 212_AF and the third sub-liner 212_CF may not extend along and on a bottom surface 213UP_BS of the second sub-filling film.

As another example, the first upper liner 212 may not include the first sub-liner 212_AF. That is, the third sub-liner 212_CF may be disposed between the first upper barrier film 211 and the second sub-filling film 213UP while the first sub-liner 212_AF is absent therebetween.

As shown in FIG. 10, the second sub-liner 212_BF may extend along and on a bottom surface 213UP_BS of the second sub-filling film. The second sub-liner 212_BF may not extend along and on a sidewall of the second sub-filling film 213UP.

In FIG. 11, the second sub-liner 212_BF may extend along and on a bottom surface 213UP_BS of the second sub-filling film and a sidewall of the second sub-filling film 213UP.

Figure 12:
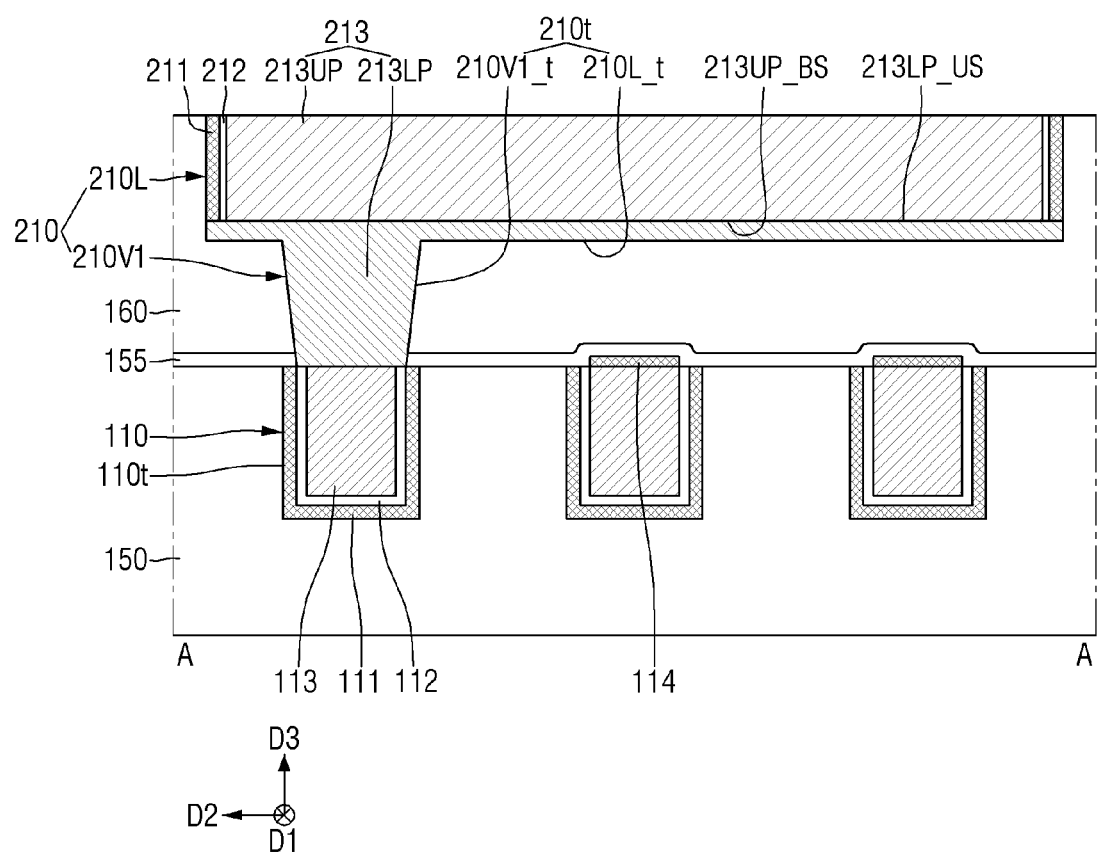
FIGS. 12 and 13 are diagrams for illustrating a semiconductor device according to some example embodiments.
Figure 13:
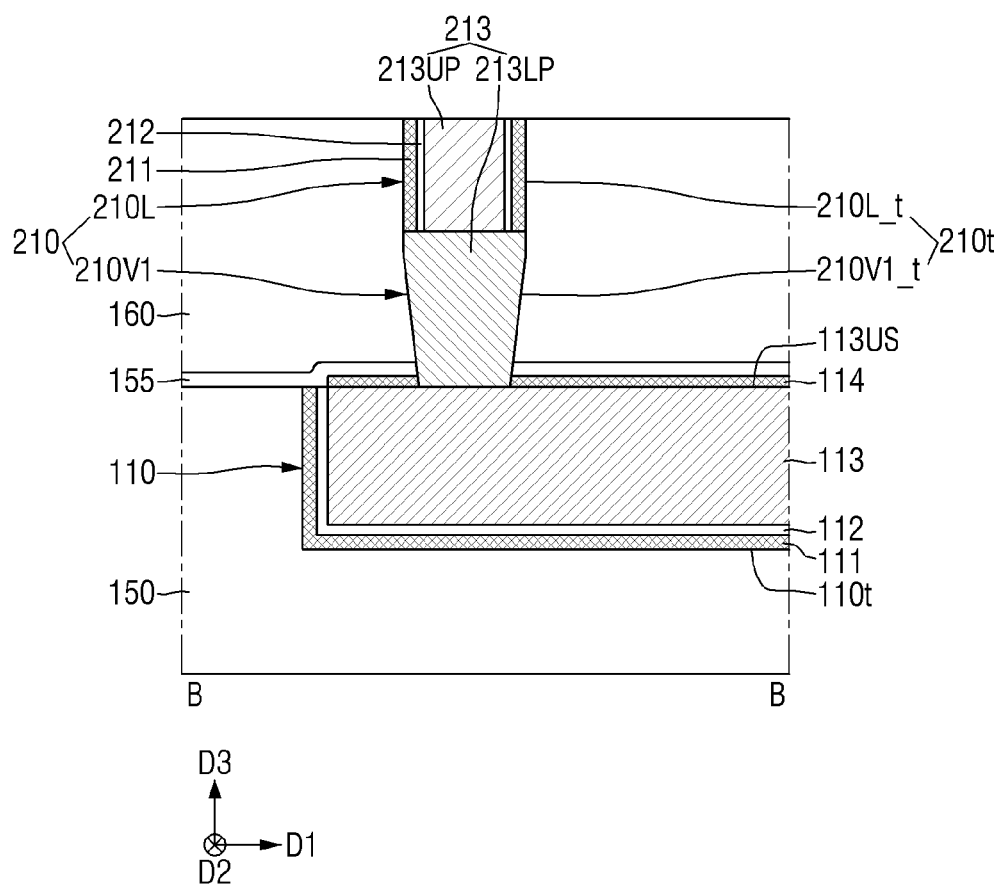

FIGS. 12 and 13 are diagrams for illustrating a semiconductor device according to some example embodiments. The following description is based on differences thereof from the description with reference to FIG. 4 to FIG. 6.

Referring to FIGS. 12 and 13, in the semiconductor device according to some example embodiments, the first upper liner 212 may be disposed between the first upper barrier film 211 and the second sub-filling film 213UP, and may not be disposed between the first sub-filling film 213LP and the second sub-filling film 213UP.

The first upper liner 212 may not extend along and on a bottom surface 213UP_BS of the second sub-filling film. The first upper liner 212 may not extend along and on a boundary between an upper surface 213LP_US of the first sub-filling film and a bottom surface 213UP_BS of the second sub-filling film.

Because the first upper liner 212 is not disposed on the first sub-filling film 213LP and the second sub-filling film 213UP, the first sub-filling film 213LP may contact the second sub-filling film 213UP.

Figure 14:
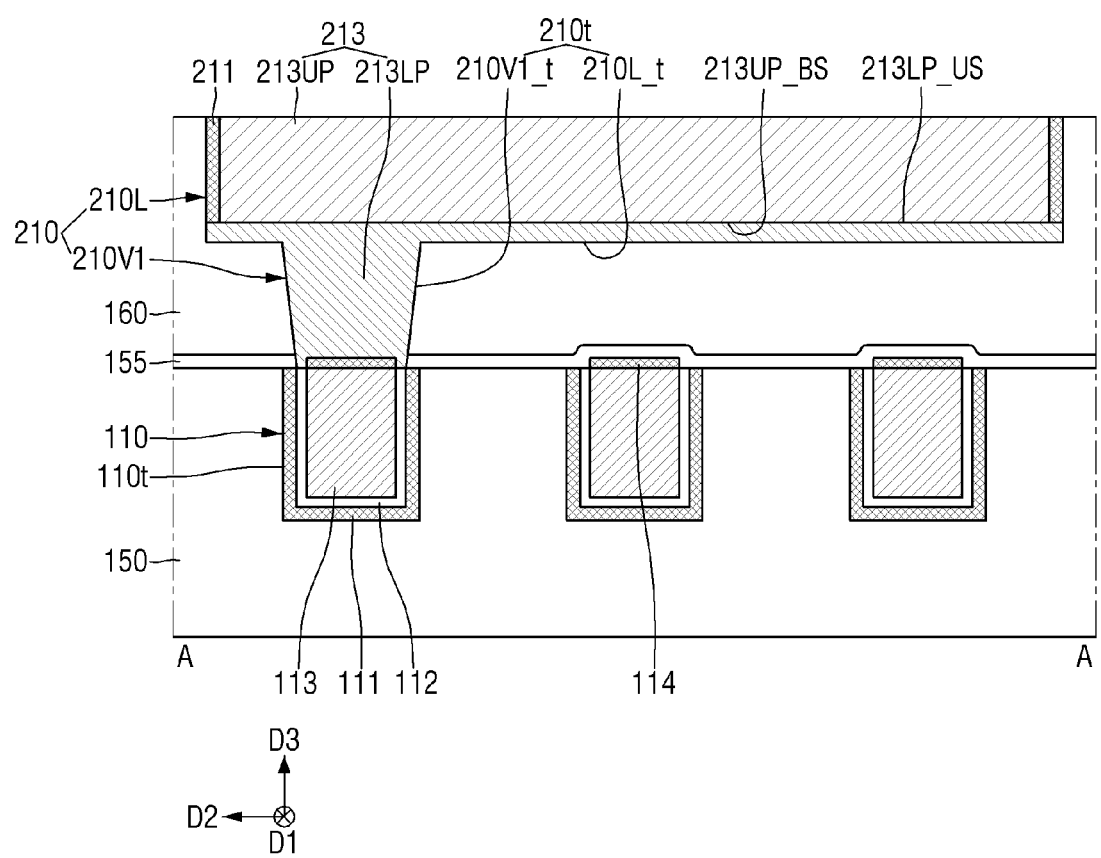
FIGS. 14 and 15 are diagrams for illustrating a semiconductor device according to some example embodiments.
Figure 15:
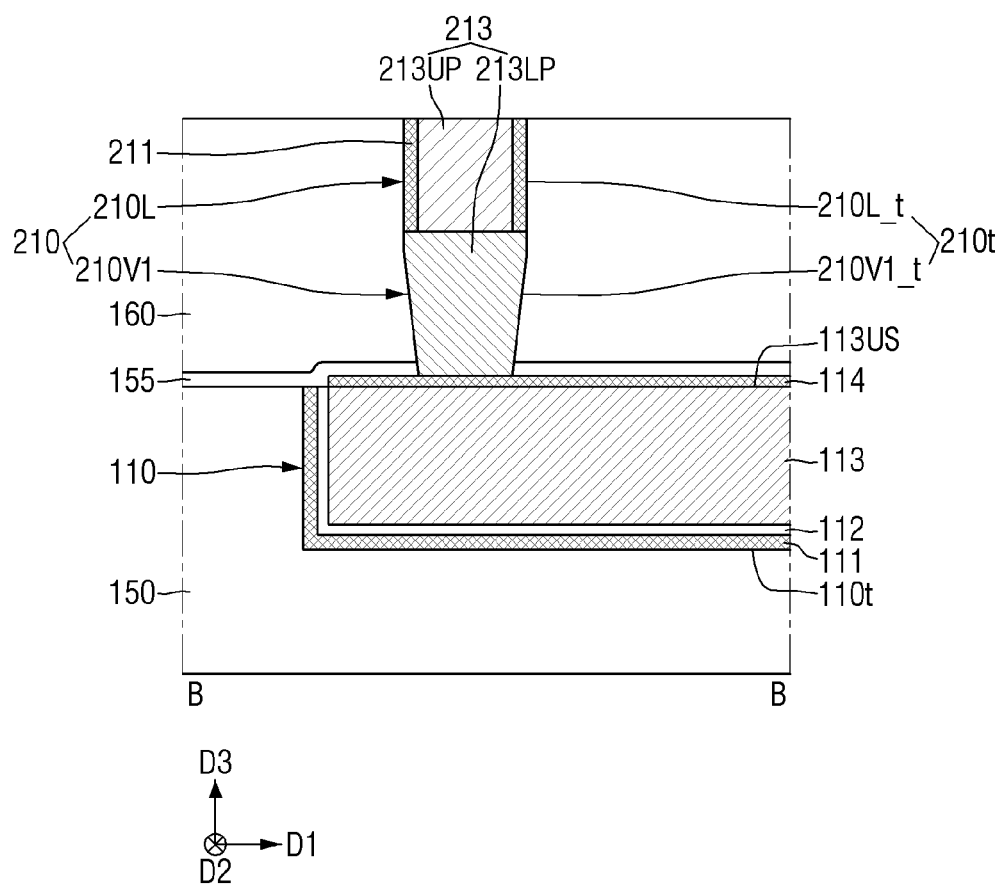

FIGS. 14 and 15 are diagrams for illustrating a semiconductor device according to some example embodiments. The following description is based on differences thereof from those described with reference to FIG. 1 to FIG. 3.

Referring to FIGS. 14 and 15, in the semiconductor device according to some example embodiments, the first sub-filling film 213LP may be in contact with an upper surface of the lower capping film 114 and side surfaces of the lower capping film 114.

The lower capping film 114 may include a bottom surface facing the lower filling film 113 and an upper surface facing away from the lower filling film 113, and side surfaces between the bottom surface and the upper surface.

The first upper line trench 210t may not extend through the lower capping film 114. The first upper line trench 210t may not expose the upper surface 113US of the lower filling film.

A sidewall of the first upper via trench 210V_t may not be defined by the lower capping film 114. A bottom surface of the first upper line trench 210t may be defined by the lower capping film 114.

Figure 16:
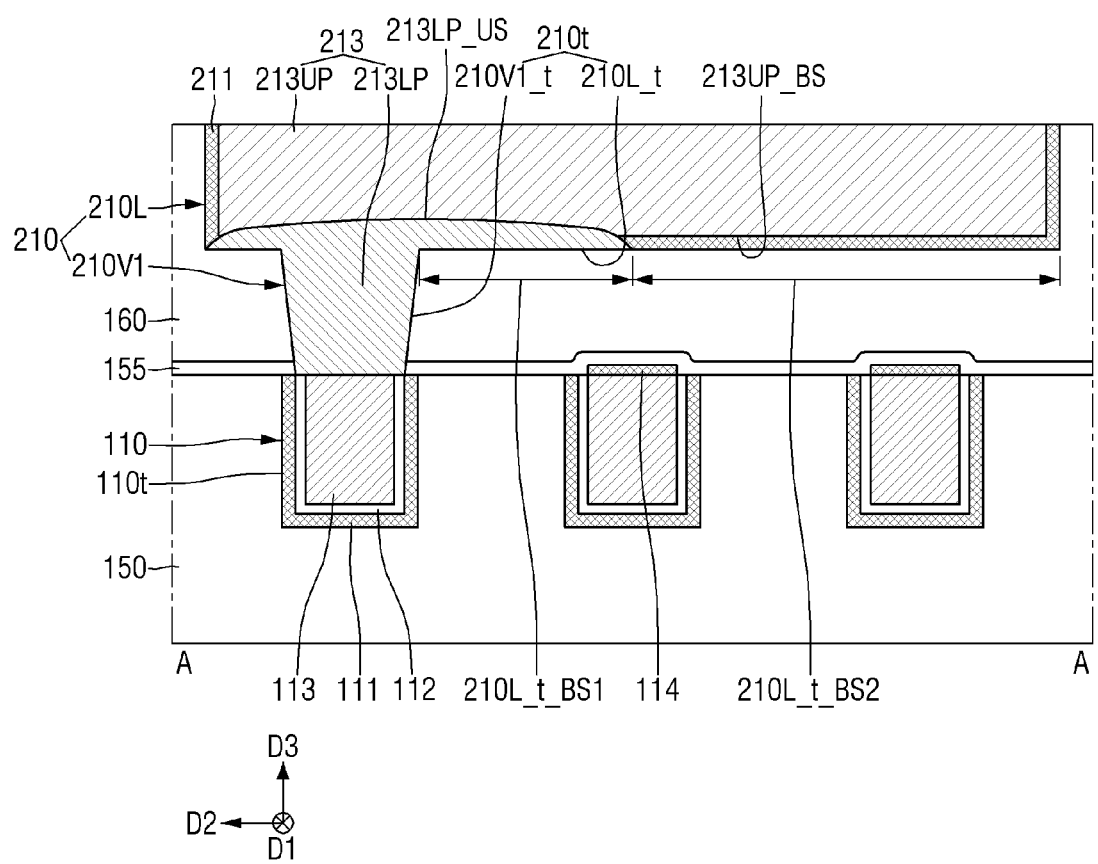
FIG. 16 is a diagram for illustrating a semiconductor device according to some example embodiments.

FIG. 16 is a diagram for illustrating a semiconductor device according to some example embodiments. The following description is based on differences thereof from those described with reference to FIG. 1 to FIG. 3.

Referring to FIG. 16, in the semiconductor device according to some example embodiments, the first sub-filling film 213LP may cover a portion of a bottom surface of the first upper wiring line trench 210L_t.

The bottom surface of the first upper line trench 210L_t may include a first area 210L_t_BS1 and a second area 210L_t_BS2. The first sub-filling film 213LP may cover the first area 210L_t_BS1 of the bottom surface of the first upper wiring line trench. The first sub-filling film 213LP may not cover the second area 210L_t_BS2 of the bottom surface of the first upper wiring line trench.

A portion of the first upper barrier film 211 may extend extends along and on a bottom surface of the first upper line trench 210L_t. The first upper barrier film 211 may extend along and on the second area 210L_t_BS2 of the bottom surface of the first upper wiring line trench. The first upper barrier film 211 may cover the second area 210L_t_BS2 of the bottom surface of the first upper wiring line trench. The first upper barrier film 211 may not extend along and on the first area 210L_t_BS1 of the bottom surface of the first upper wiring line trench.

At least a portion of the upper surface 213LP_US of the first sub-filling film may include an upwardly convex curved surface. A portion of the bottom surface 213UP_BS of the second sub-filling film may be in contact with the upper surface 213LP_US of the first sub-filling film. The remainder of the bottom surface 213UP_BS of the second sub-filling film may be in contact with the first upper barrier film 211. A portion of the upper surface 213LP_US of the first sub-filling film 213LP may be in contact with the first upper barrier film 211.

As shown in FIGS. 12 and 13, when the first upper liner 212 is not disposed between the first sub-filling film 213LP and the second sub-filling film 213UP, the first upper liner 212 may extend along and on the first upper barrier film 211 extending along and on the bottom surface of the first upper wiring line trench 210L_t.

Figure 17:
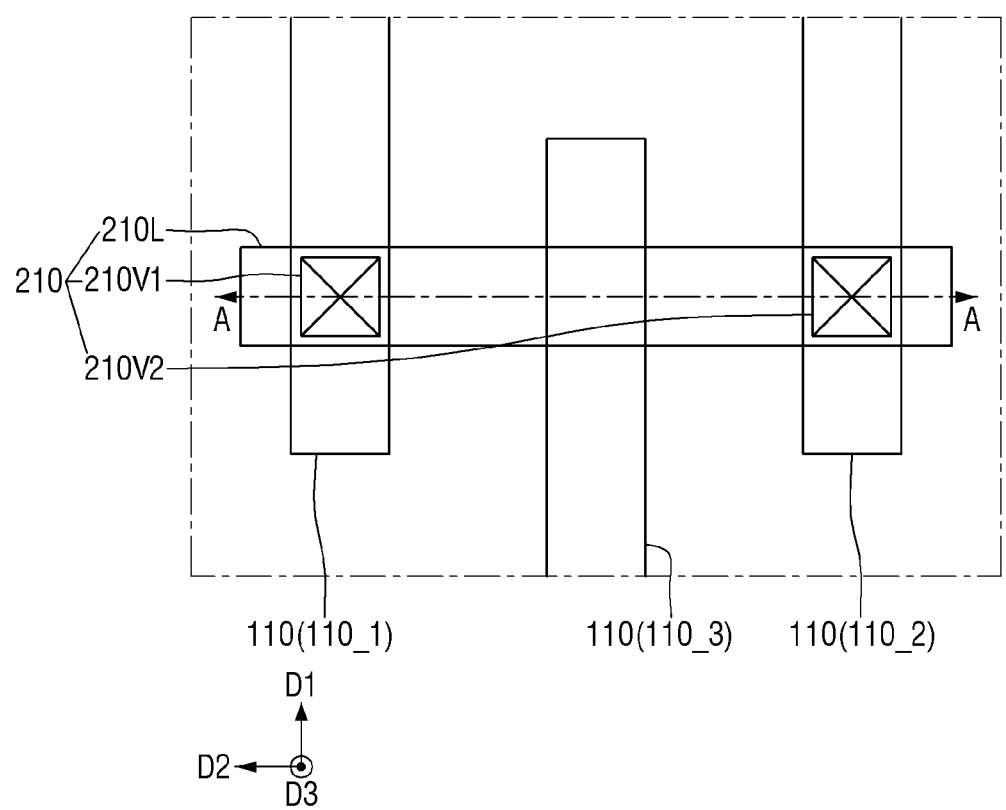
FIG. 17 is an illustrative layout diagram for illustrating a semiconductor device according to some example embodiments.
Figure 18:
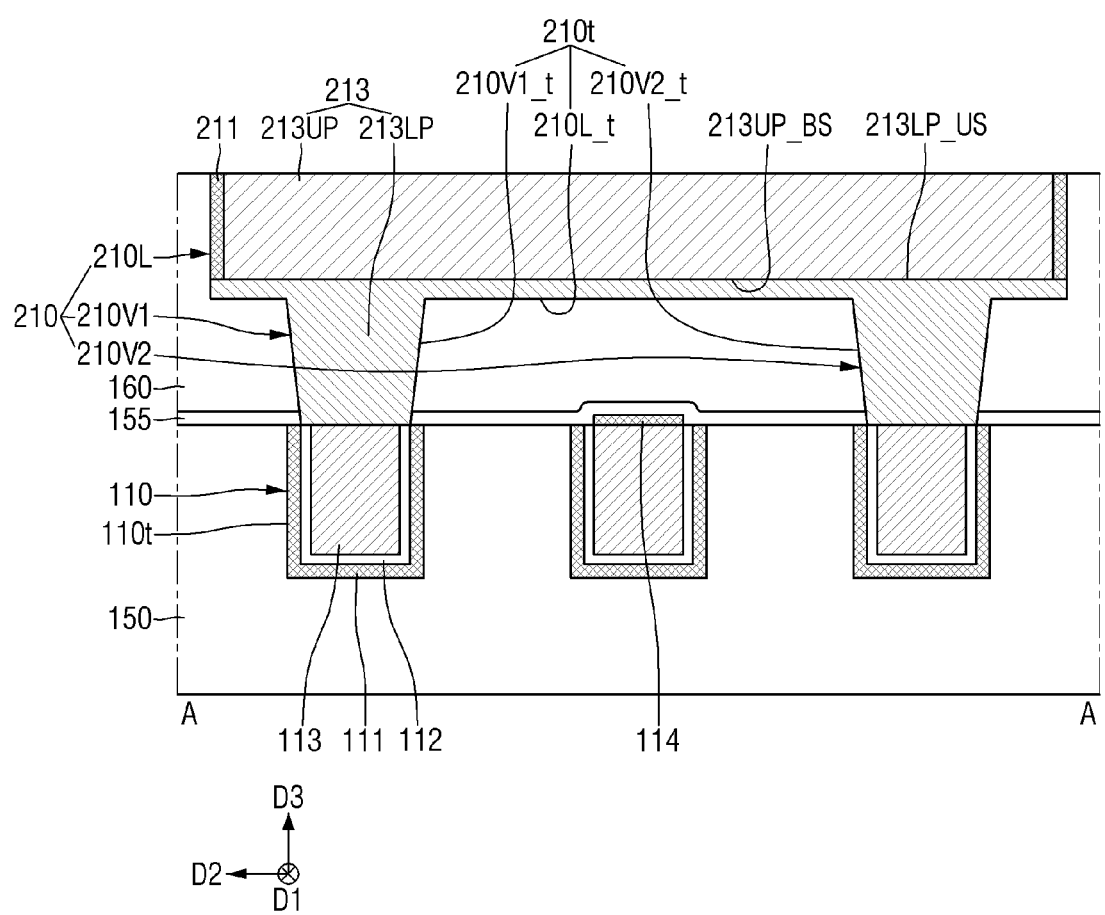
FIG. 18 is an illustrative cross-sectional view taken along A-A of FIG. 17.

FIG. 17 is an illustrative layout diagram for illustrating a semiconductor device according to some example embodiments. FIG. 18 is an illustrative cross-sectional view taken along A-A of FIG. 17. The following description is based on differences thereof from those described with reference to FIG. 1 to FIG. 3.

Referring to FIGS. 17 and 18, in the semiconductor device according to some example embodiments, the first upper line structure 210 includes the first upper wiring line 210L, the first upper via 210V1, and the second upper via 210V2.

The second upper via 210V2 may connect the first upper wiring line 210L and the lower line structure 110 to each other. The second upper via 210V2 may be in contact with the lower line structure 110. For example, the second upper via 210V2 may be in contact with the lower liner 112 and the lower filling film 113, which are portions of the lower line structure 110. For example, the second upper via 210V2 may connect the first upper wiring line 210L and the second lower line structure 110_2 to each other. The first upper line structure 210 may be connected to a plurality of lower line structures 110.

The first upper line trench 210t may include the first upper via trench 210V1_t, the second upper via trench 210V2_t, and the first upper line trench 210L_t. The second upper via trench 210V2_t may be formed in a bottom surface of the first upper line trench 210L_t.

The bottom surface of the first upper line trench 210t may include a bottom surface of the first upper via trench 210V1_t and a bottom surface of the second upper via trench 210V2_t. For example, the bottom surface of the second upper via trench 210V2_t may be defined by the second lower line structure 110_2. A sidewall of the second upper via trench 210V2_t may be defined by the second interlayer insulating film 160 and the first etch stop film 155.

The second upper via 210V2 may be disposed in the second upper via trench 210V2_t. The first sub-filling film 213LP may fill an entirety of the second upper via trench 210V2_t. The first sub-filling film 213LP may be in contact with the second interlayer insulating film 160 defining a sidewall of the second upper via trench 210V2_t. The second upper via 210V2 may include only the first sub-filling film 213LP.

Figure 19:
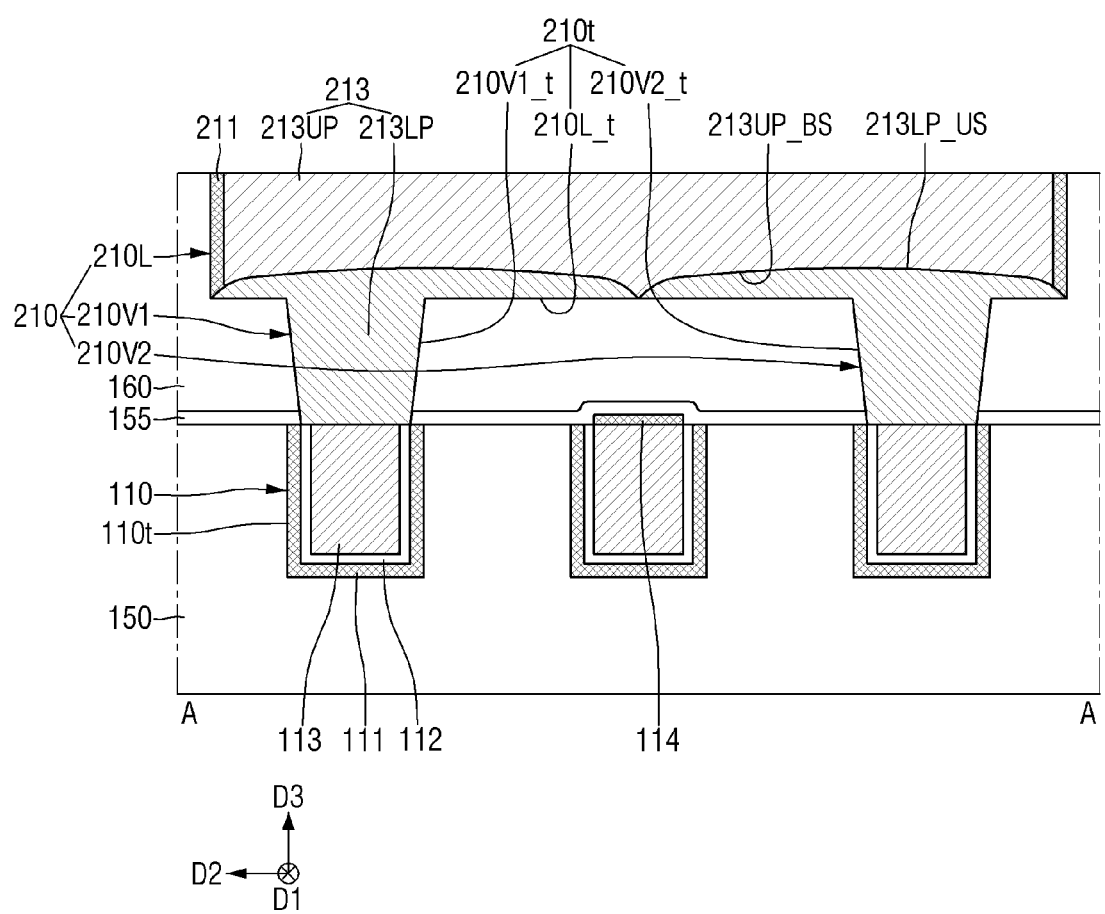
FIGS. 19 and 20 are diagrams for illustrating semiconductor devices according to some example embodiments, respectively.
Figure 20:
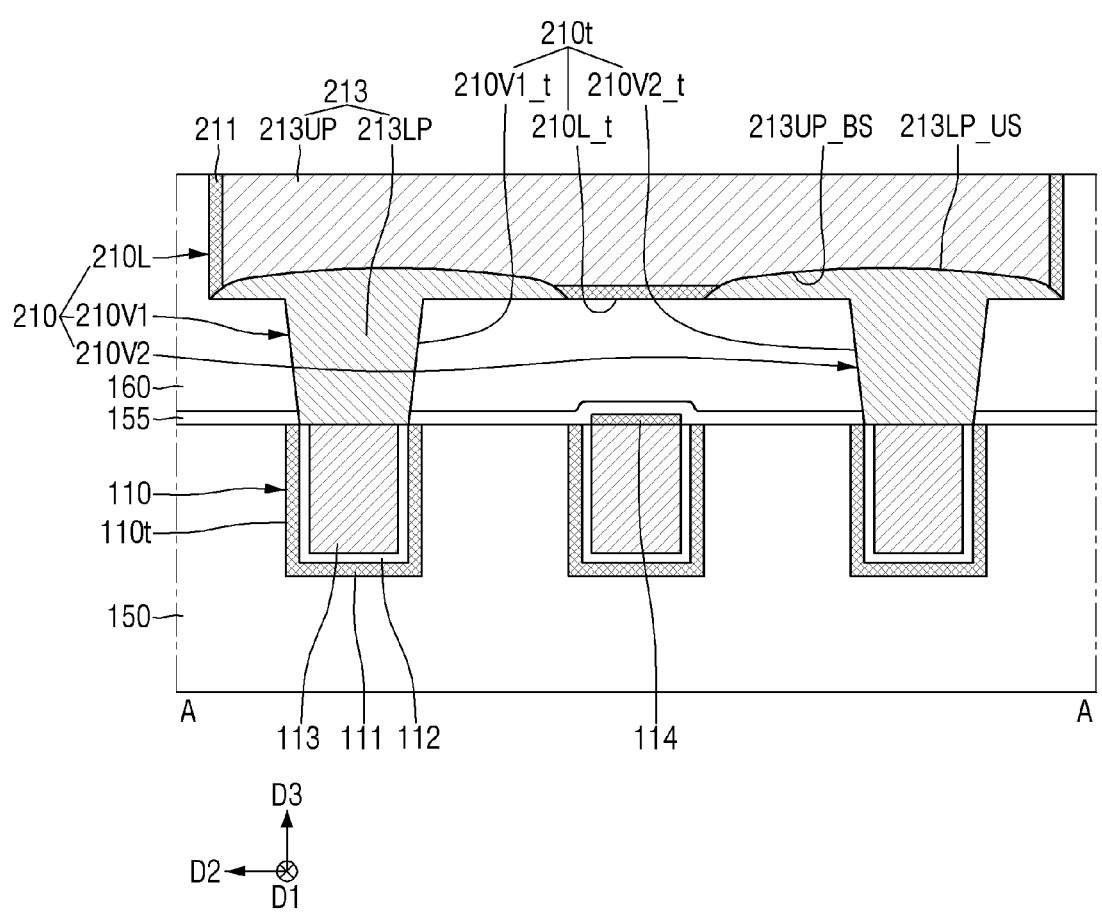

FIGS. 19 and 20 are diagrams for illustrating semiconductor devices according to some example embodiments, respectively. The following description is based on differences thereof from those described with reference to FIGS. 17 and 18.

Referring to FIG. 19, in the semiconductor device according to some example embodiments, at least a portion of the upper surface 213LP_US of the first sub-filling film filling the first upper via trench 210V1_t may include a convex curved surface. At least a portion of the upper surface 213LP_US of the first sub-filling film filling the second upper via trench 210V2_t may include a convex curved surface.

The first sub-filling film 213LP filling the first upper via trench 210V1_t may be in contact with the first sub-filling film 213LP filling the second upper via trench 210V2_t. The first sub-filling film 213LP may cover an entirety of the bottom surface of the first upper wiring line trench 210L_t.

Referring to FIG. 20, in the semiconductor device according to some example embodiments, the first sub-filling film 213LP filling the first upper via trench 210V1_t and the first sub-filling film 213LP filling the second upper via trench 210V2_t may not cover an entirety of the bottom surface of the first upper wiring line trench 210L_t.

A portion of the first upper barrier film 211 may extend along and on a bottom surface of the first upper line trench 210L_t. Each of the upper surface 213LP_US of the first sub-filling film filling the first upper via trench 210V1_t and the first sub-filling film 213LP_US filling the second upper via trench 210V2_t may include a convex curved surface. For example, the portion of the first upper bather film 211 extending along and on the bottom surface of the first upper line trench 210L_t may partially extend along and on the upper surface 213LP_US of the first sub-filling film.

Figure 21:
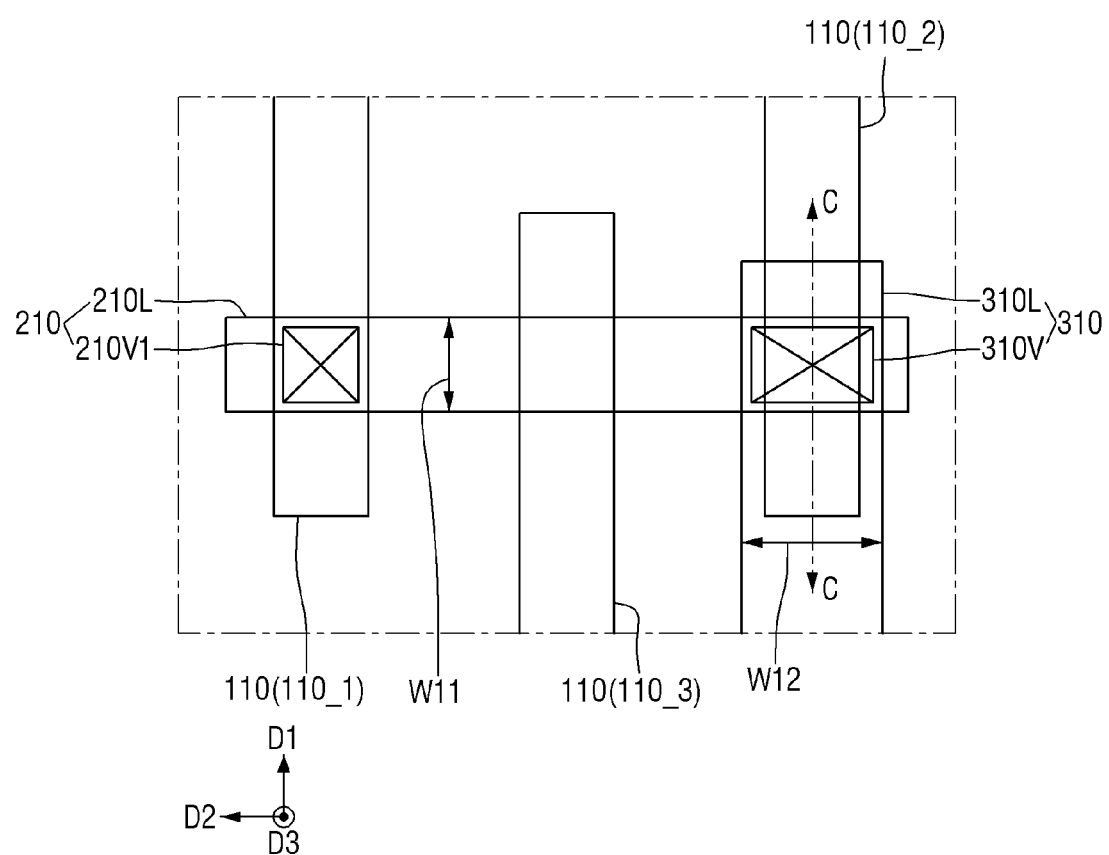
FIG. 21 is an illustrative layout diagram for illustrating a semiconductor device according to some example embodiments.
Figure 22:
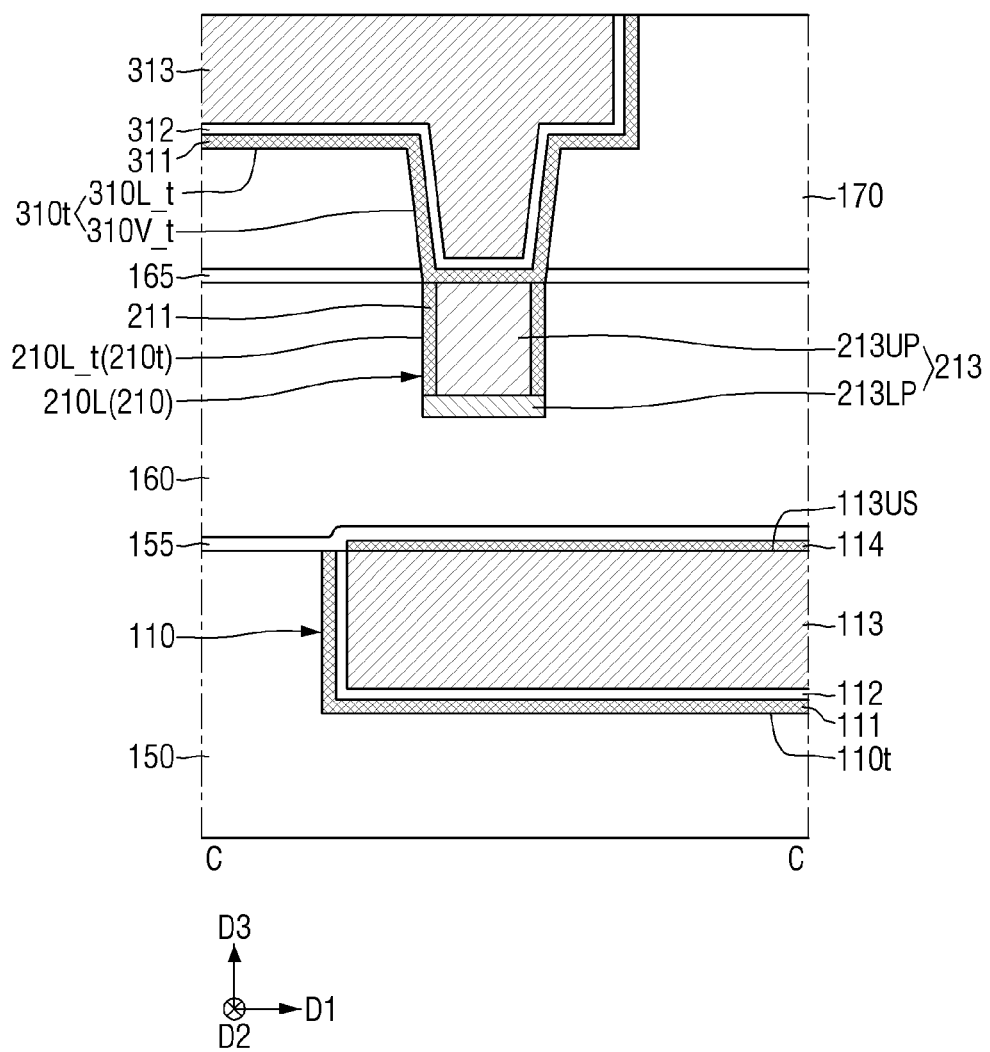
FIG. 22 is an illustrative cross-sectional view taken along C-C of FIG. 21.

FIG. 21 is an illustrative layout diagram for illustrating a semiconductor device according to some example embodiments. FIG. 22 is an illustrative cross-sectional view taken along C-C of FIG. 21. The following description is based on differences thereof from those described with reference to FIG. 1 to FIG. 3.

Referring to FIGS. 21 and 22, the semiconductor device according to some example embodiments may further include a second upper line structure 310.

A second etch stop film 165 may be disposed on the first upper line structure 210 and the second interlayer insulating film 160. A third interlayer insulating film 170 may be disposed on the second etch stop film 165. The second etch stop film 165 may be disposed between the second interlayer insulating film 160 and the third interlayer insulating film 170.

The third interlayer insulating film 170 may include a second upper line trench 310t. The second upper line trench 310t may extend through the second etch stop film 165. The second upper line trench 310t may expose a portion of the first upper line structure 210.

The second upper line trench 310t may include a third upper via trench 310V_t and a second upper wiring line trench 310L_t. The second upper wiring line trench 310L_t may extend in an elongated manner in the first direction D1. The second upper wiring line trench 310L_t may extend to an upper surface of the third interlayer insulating film 170.

The third upper via trench 310V_t may be formed in a bottom surface of the second upper wiring line trench 310L_t. For example, a bottom surface of the second upper line trench 310t may be a bottom surface of the third upper via trench 310V_t.

A sidewall of the second upper line trench 310t may include a sidewall and a bottom surface of the second upper wiring line trench 310L_t, and a sidewall of the third upper via trench 310V_t.

The third interlayer insulating film 170 may include, for example, at least one of silicon oxide, silicon nitride, silicon oxynitride, and a low dielectric constant material.

The second etch stop film 165 may include a material having an etch selectivity with respect to the third interlayer insulating film 170. The second etch stop film 165 may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), aluminum oxide (AlO), aluminum nitride (AlN), aluminum oxycarbide (AlOC), and combinations thereof.

The second upper line structure 310 may be disposed in the second upper line trench 310t. The second upper line structure 310 may fill the second upper line trench 310t. The second upper line structure 310 may be disposed in the third interlayer insulating film 170.

The second upper line structure 310 may be disposed on the first upper line structure 210. The second upper line structure 310 may be connected to the first upper line structure 210. The second upper line structure 310 may be in contact with the first upper line structure 210.

The second upper line structure 310 may include a second upper wiring line 310L and a third upper via 310V. The third upper via 310V may connect the second upper wiring line 310L and the first upper line structure 210 to each other. The third upper via 310V may be in contact with the first upper wiring line 210L.

The second upper line structure 310 may fill the third upper via trench 310V_t and the second upper wiring line trench 310L_t. The second upper wiring line 310L may be disposed in the second upper wiring line trench 310L_t. The third upper via 310V may be disposed in the third upper via trench 310V_t.

The second upper wiring line 310L may be disposed at a third metal level different from the second metal level. The second upper wiring line 310L may be disposed at the third metal level higher than the second metal level.

The second upper line structure 310 may include a second upper barrier film 311, a second upper liner 312, and a second upper filling film 313. The second upper liner 312 may be disposed between the second upper barrier film 311 and the second upper filling film 313.

The second upper barrier film 311 may extend along and on a sidewall and a bottom surface of the second upper line trench 310t. The second upper liner 312 may be disposed on the second upper bather film 311. The second upper liner 312 may extend along and on a sidewall and a bottom surface of the second upper line trench 310t while being disposed on the second upper bather film 311.

The second upper filling film 313 may be disposed on the second upper liner 312. The second upper filling film 313 may fill the remainder of the second upper line trench 310t.

Materials included in each of the second upper barrier film 311, the second upper liner 312, and the second upper filling film 313 may be the same as the those included in each of the lower barrier film 111, the lower liner 112, and the lower filling film 113.

As another example, the second upper line structure 310 may be omitted from the second upper liner 312. The second upper filling film 313 may be directly disposed on the second upper barrier film 311.

A width W11 of the first upper wiring line 210L in the first direction D1 may be different from a width W12 of the second upper wiring line 310L in the second direction D2. For example, the width W12 of the second upper wiring line 310L in the second direction D2 may be greater than the width W11 of the first upper wiring line 210L in the first direction D1.

A conductive layer structure of the second upper line structure 310 may be different from a conductive layer structure of the first upper line structure 210. Based on a width of a wiring line disposed at each metal level, a conductive film structure of a line structure may vary so as to lower a resistance value of the line structure.

As an example, the conductive layer structure of the second upper line structure 310 may be the same as the conductive layer structure of the first upper line structure 210.

Figure 23:
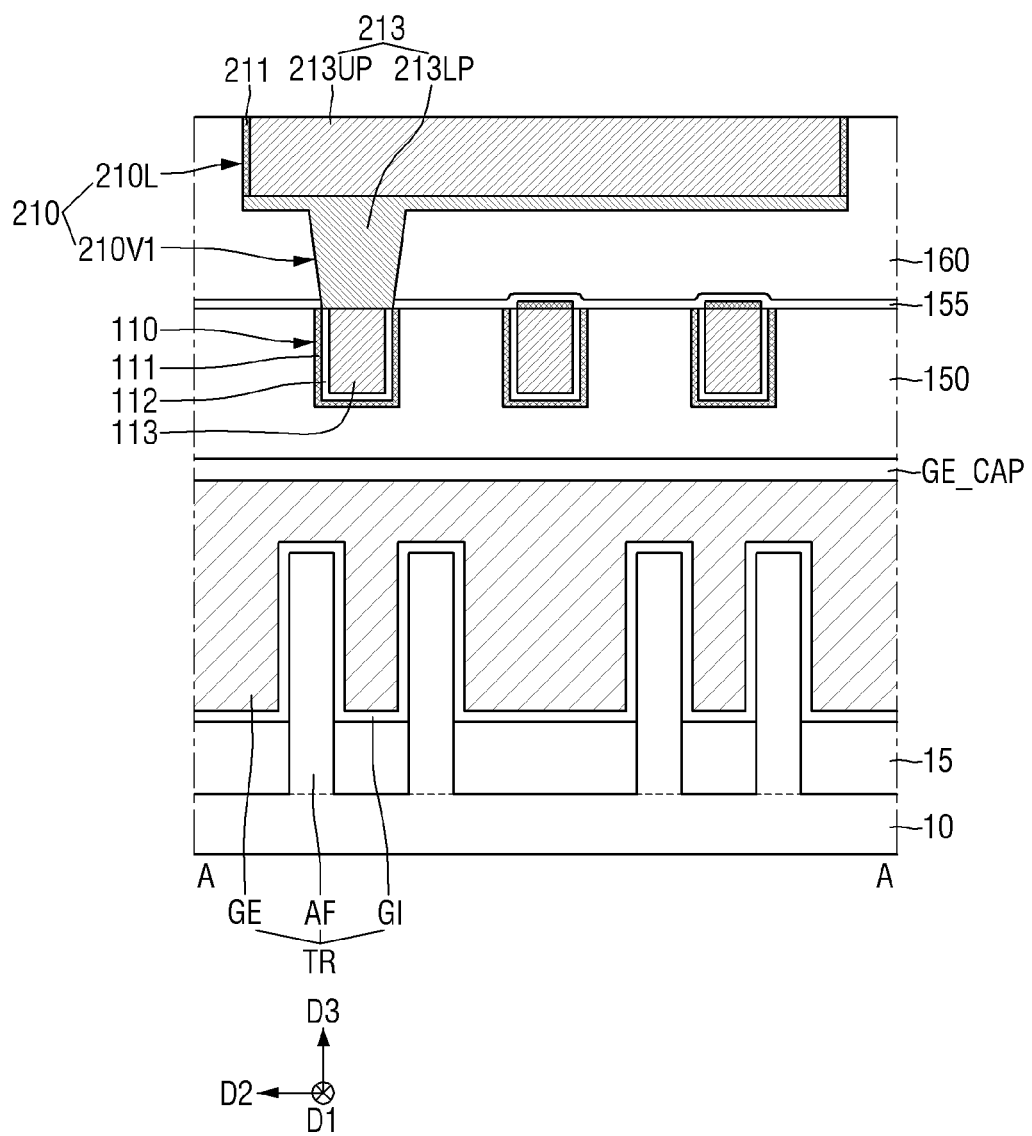
FIG. 23 is a diagram for illustrating a semiconductor device according to some example embodiments.

FIG. 23 is a diagram for illustrating a semiconductor device according to some example embodiments. The following description is based on differences thereof from those described with reference to FIG. 1 to FIG. 3.

For reference, FIG. 23 shows an example of cutting along a first gate electrode GE.

In FIG. 23, it is illustrated that a fin-type pattern AF extends in the first direction D1 and the first gate electrode GE extends in the second direction D2. However, the present disclosure is not limited thereto.

Referring to FIG. 23, the semiconductor device according to some example embodiments may include a transistor TR disposed between a substrate 10 and the lower line structure 110.

The substrate 10 may be a silicon substrate or a silicon-on-insulator (SOI). Alternatively, the substrate 10 may include, but is not limited to, silicon germanium, SGOI (silicon germanium on insulator), indium antimonide, lead telluride compound, indium arsenide, indium phosphide, gallium arsenide, or gallium antimonide.

The transistor TR may include the fin-type pattern AF, the first gate electrode GE on the fin-type pattern AF, and a first gate insulating film GI between the fin-type pattern AF and the first gate electrode GE.

The transistor TR may include source and drain patterns respectively disposed on both sides of the first gate electrode GE.

The fin-type pattern AF may protrude from the substrate 10. The fin-type pattern AF may extend in the first direction D1. The fin-type pattern AF may be a portion of the substrate 10, or may include an epitaxial layer grown from the substrate 10. The fin-type pattern AF may include, for example, silicon or germanium as an elemental semiconductor material. Further, the fin-type pattern AF may include a compound semiconductor, for example, a group IV-IV compound semiconductor or a group III-V compound semiconductor.

The group IV-IV compound semiconductor may include, for example, a binary compound including two of carbon (C), silicon (Si), germanium (Ge), and tin (Sn), a ternary compound including three thereof, or a compound obtained by doping a group IV element thereto. The group III-V compound semiconductor may include, for example, a binary compound obtained by combining one of aluminum (Al), gallium (Ga), and indium (In) as a group III element and one of phosphorus (P), arsenic (As), and antimony (Sb) as a group V element with each other, a ternary compound obtained by combining two of aluminum (Al), gallium (Ga), and indium (In) as a group III element and one of phosphorus (P), arsenic (As), and antimony (Sb) as a group V with each other, or a quaternary compound obtained by combining three of aluminum (Al), gallium (Ga), and indium (In) as a group III element and one of phosphorus (P), arsenic (As), and antimony (Sb) as a group V with each other.

A field insulating film 15 may be formed on the substrate 10. The field insulating film 15 may be formed on a portion of a sidewall of the fin-type pattern AF. The fin-type pattern AF may protrude upwardly beyond an upper surface of the field insulating film 15. The field insulating film 15 may include, for example, an oxide film, a nitride film, an oxynitride film, or a combination film thereof.

The first gate electrode GE may be disposed on the fin-type pattern AF. The first gate electrode GE may extend in the second direction D2. The first gate electrode GE may intersect the fin-type pattern AF.

The first gate electrode GE may include, for example, at least one of a metal, a conductive metal nitride, a conductive metal carbide, a conductive metal carbide, a metal silicide, a doped semiconductor material, a conductive metal oxynitride, and a conductive metal oxide.

The first gate insulating film GI may be disposed between the first gate electrode GE and the fin-type pattern AF and between the first gate electrode GE and the field insulating film 15. The first gate insulating film GI may include, for example, silicon oxide, silicon oxynitride, silicon nitride, or a high dielectric constant material having a higher dielectric constant than that of silicon oxide. The high dielectric constant material may include, for example, at least one of boron nitride, metal oxide, and metal silicon oxide.

The semiconductor device according to some example embodiments may include an NC (negative capacitance) FET using a negative capacitor. For example, the first gate insulating film GI may include a ferroelectric material film having ferroelectric properties and a paraelectric material film having paraelectric properties.

The ferroelectric material film may have negative capacitance, and the paraelectric material film may have positive capacitance. For example, when two or more capacitors are connected in series to each other and capacitance of each of the capacitors has a positive value, a total capacitance is smaller than capacitance of each individual capacitor. On the contrary, when at least one of capacitances of two or more capacitors connected in series to each other has a negative value, a total capacitance may have a positive value that is greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Do to the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. In this connection, in one example, hafnium zirconium oxide may refer to a material obtain by doping hafnium oxide with zirconium (Zr). In another example, hafnium zirconium oxide may refer to a compound of hafnium (Hf), zirconium (Zr), and oxygen (O).

The ferroelectric material film may further contain doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). A type of the dopant contained in the ferroelectric material film may vary depending on a type of the ferroelectric material included in the ferroelectric material film.

When the ferroelectric material film includes hafnium oxide, the dopant contained in the ferroelectric material film may include, for example, at least one of gadolinium (Gd), silicon (Si), zirconium (Zr), aluminum (Al), and yttrium (Y).

When the dopant is aluminum (Al), the ferroelectric material film may contain about 3 to about 8 at % (atomic %) of aluminum. In this connection, a content of the dopant may be a content of aluminum based on a sum of hafnium and aluminum.

When the dopant is silicon (Si), the ferroelectric material film may contain about 2 to about 10 at % of silicon. When the dopant is yttrium (Y), the ferroelectric material film may contain about 2 to about 10 at % yttrium. When the dopant is gadolinium (Gd), the ferroelectric material film may contain about 1 to about 7 at % gadolinium. When the dopant is zirconium (Zr), the ferroelectric material film may contain about 50 to about 80 at % zirconium.

The paraelectric material film may have paraelectric properties. The paraelectric material film may include, for example, at least one of silicon oxide and metal oxide having a high dielectric constant. Although the metal oxide contained in the paraelectric material film may include, for example, at least one of hafnium oxide, zirconium oxide and aluminum oxide, the present disclosure is not limited thereto.

The ferroelectric material film and the paraelectric material film may include the same material. The ferroelectric material film may have ferroelectric properties, whereas the paraelectric material film may not have the ferroelectric properties. For example, when each of the ferroelectric material film and the paraelectric material film includes hafnium oxide, a crystal structure of hafnium oxide contained in the ferroelectric material film may be different from a crystal structure of hafnium oxide contained in the paraelectric material film.

The ferroelectric material film may have a thickness sized to exhibit ferroelectric properties. Although the thickness of the ferroelectric material film may be, for example, in a range of about 0.5 to about 10 nm, the present disclosure is not limited thereto. Because a critical thickness exhibiting the ferroelectric properties may be vary based on a type of the ferroelectric material, the thickness of the ferroelectric material film may vary depending on the type of the ferroelectric material.

In one example, the first gate insulating film GI may include one ferroelectric material film. In another example, the first gate insulating film GI may include a plurality of ferroelectric material films spaced apart from each other. The first gate insulating film GI may have a stack structure in which a plurality of ferroelectric material films and a plurality of paraelectric material films are alternately stacked.

A gate capping pattern GE_CAP may be disposed on the first gate electrode GE. The lower line structure 110 may be disposed on the first gate electrode GE. The lower line structure 110 is illustrated as not being connected to the first gate electrode GE. However, the present disclosure is not limited thereto. One of the lower line structures 110 may be connected to the first gate electrode GE.

Figure 24:
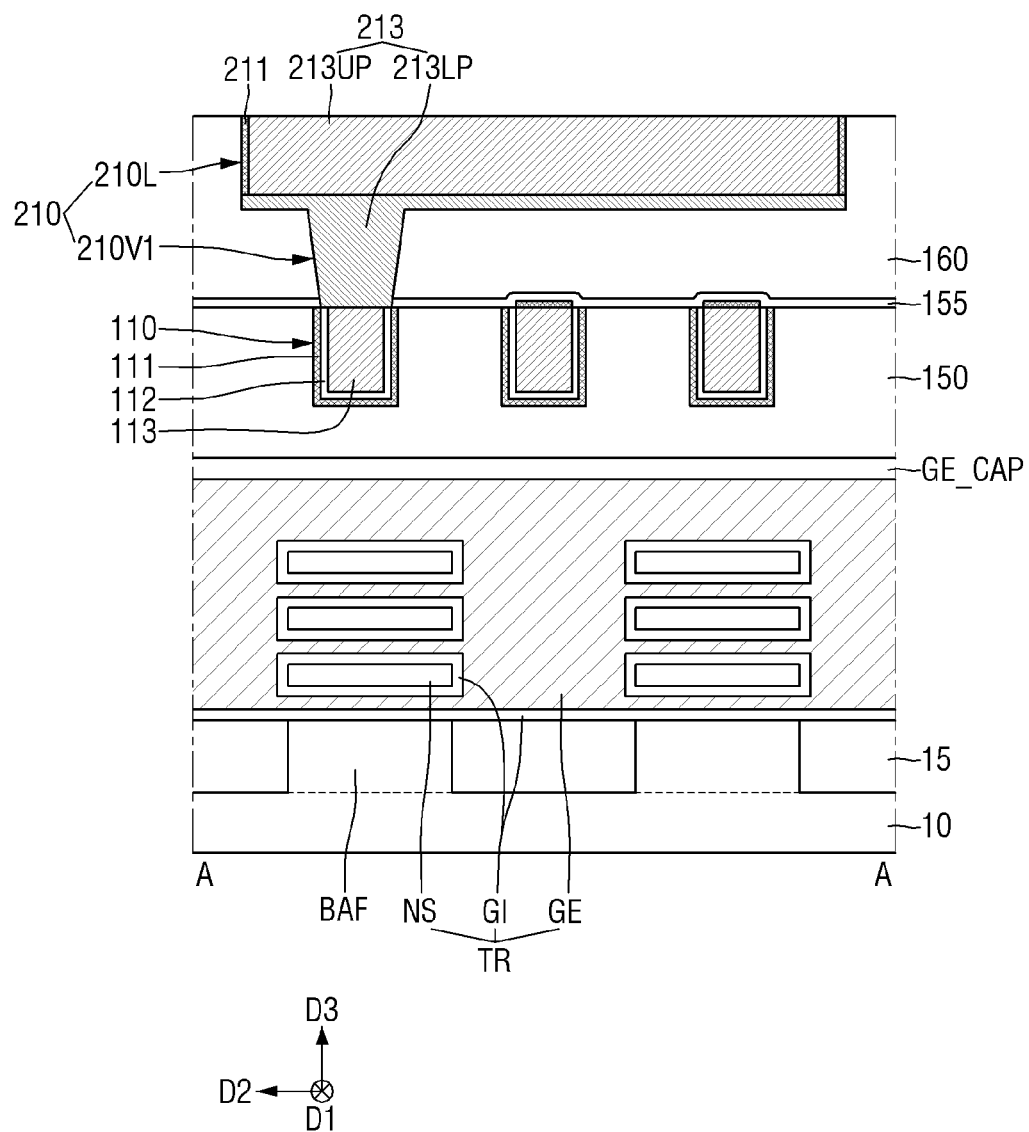
FIG. 24 is a diagram for illustrating a semiconductor device according to some example embodiments.

FIG. 24 is a diagram for illustrating a semiconductor device according to some example embodiments. The following description is based on differences thereof from the description with reference to FIG. 23.

Referring to FIG. 24, in the semiconductor device according to some example embodiments, the transistor TR may include a nanosheet NS, the first gate electrode GE surrounding the nanosheet NS, and the first gate insulating film GI between the nanosheet NS and the first gate electrode GE.

The nanosheet NS may be disposed on a lower fin-type pattern BAF. The nanosheet NS may be spaced apart from the lower fin-type pattern BAF along the third direction D3. The transistor TR is shown as including three nanosheets NS spaced apart from each other along the third direction D3. However, the disclosure is not limited thereto. In another example, the number of nanosheets NS arranged in the third direction D3 and disposed on the lower fin-type pattern BAF may be greater than three or may be less than three.

Each of the lower fin-type pattern BAF and the nanosheet NS may include, for example, silicon or germanium as an elemental semiconductor material. Each of the lower fin-type pattern BAF and the nanosheet NS may include a compound semiconductor, for example, a group IV-IV compound semiconductor or a group III-V compound semiconductor. The lower fin-type pattern BAF and the nanosheet NS may include the same material, or may include different materials.

Figure 25:
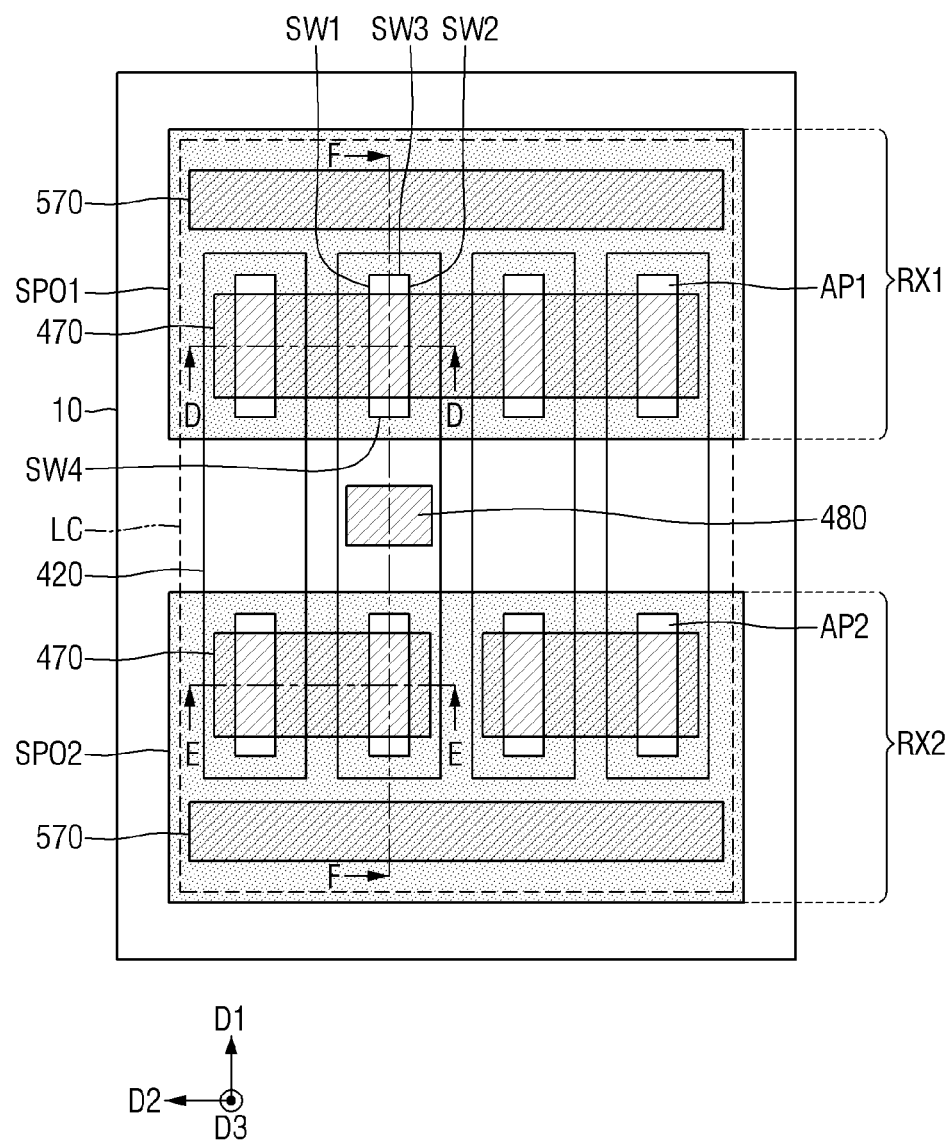
FIG. 25 to FIG. 27 are diagrams for illustrating a semiconductor device according to some example embodiments.
Figure 26:
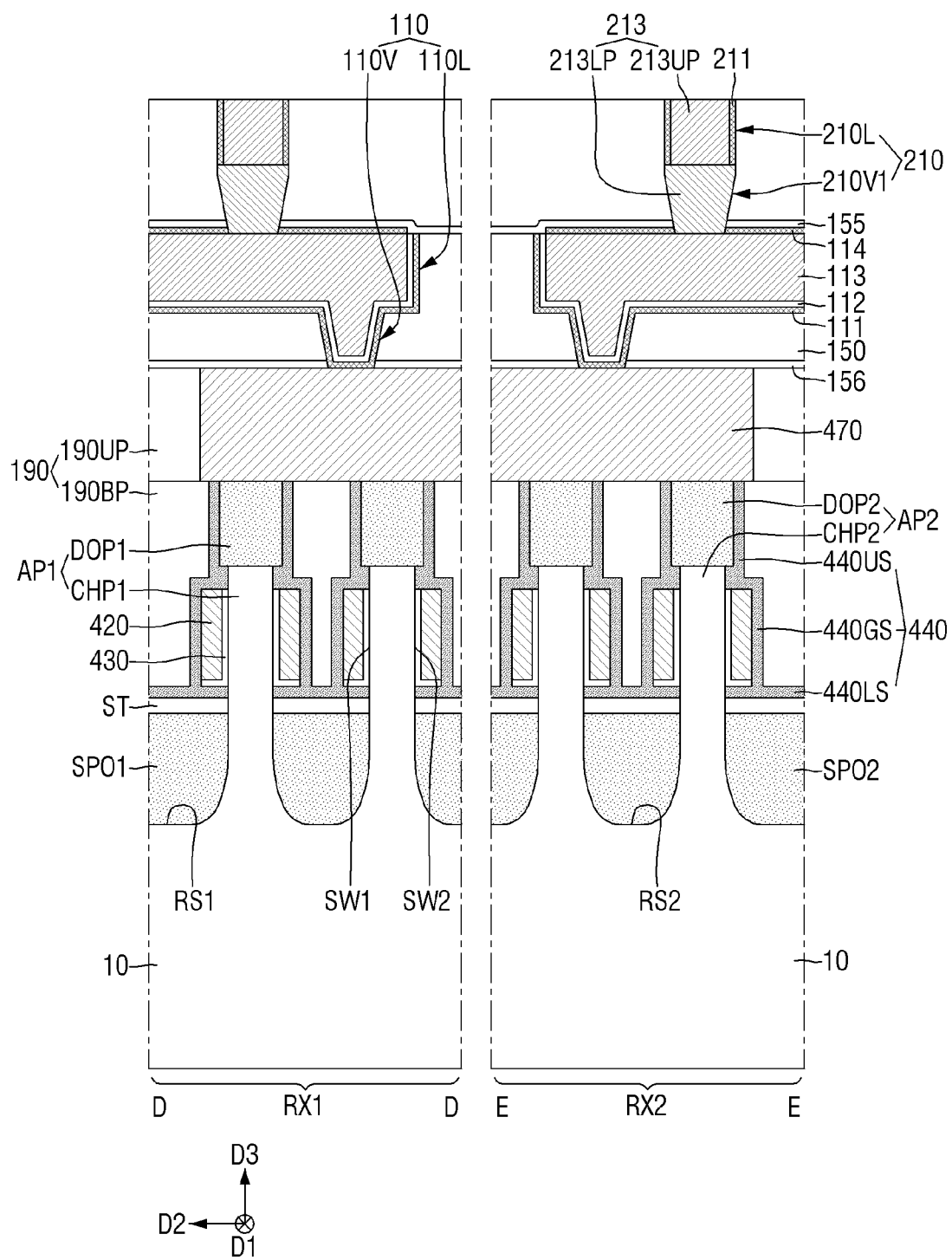
Figure 27:
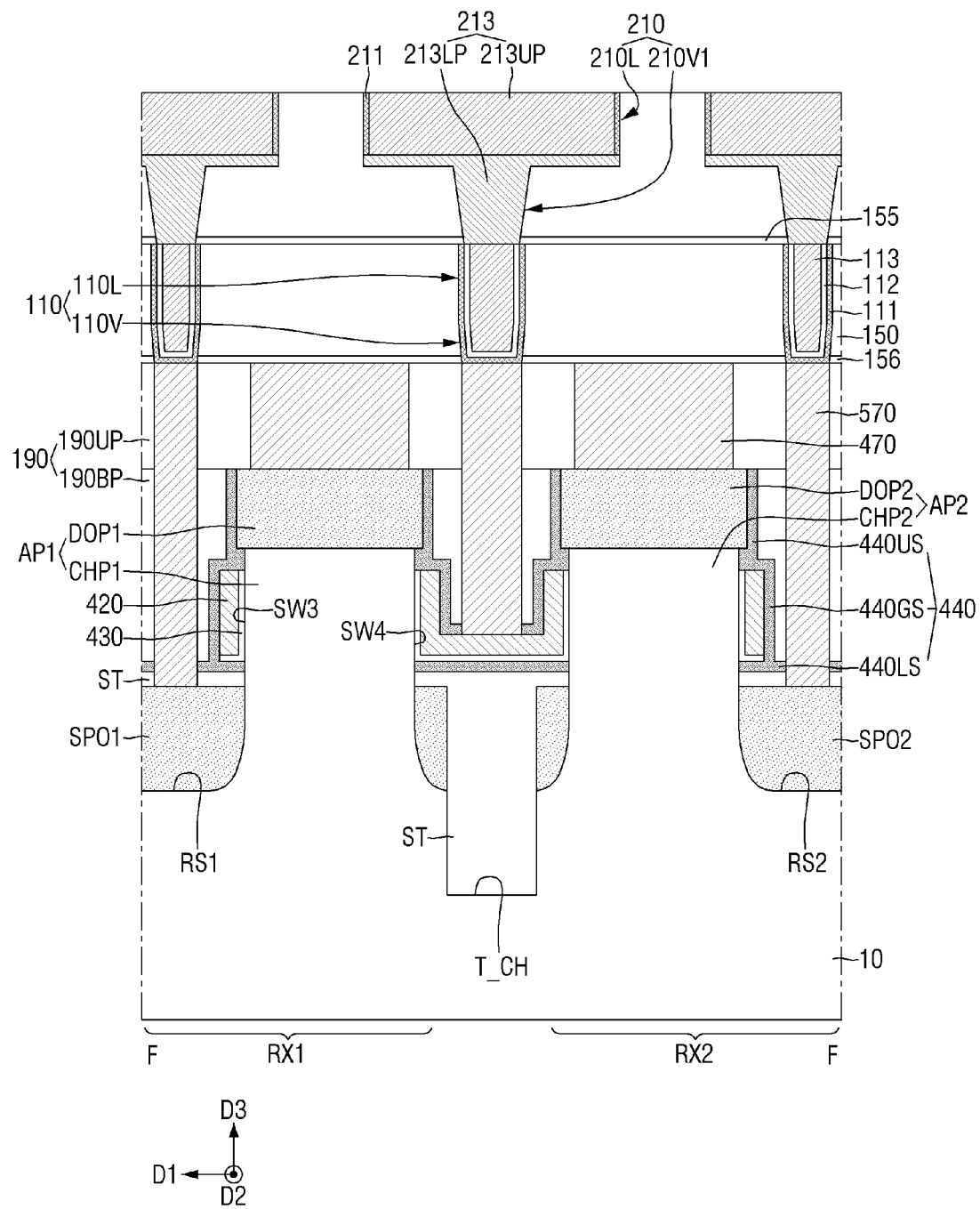

FIG. 25 to FIG. 27 are diagrams for illustrating a semiconductor device according to some example embodiments. For reference, FIG. 25 is a plan view for illustrating a semiconductor device according to some example embodiments. FIG. 26 is a cross-sectional view taken along D-D and E-E of FIG. 25. FIG. 27 is a cross-sectional view taken along F-F of FIG. 25.

Referring to FIG. 25 to FIG. 27, a logic cell LC may be disposed on substrate 10. The logic cell LC may indicate a logic element that performs a specific function. For example, the logic element may include circuitry such as an inverter, a flip-flop transistors, capacitors, logic gates, or other circuit elements. The logic cell LC may include vertical transistors (Vertical FETs) constituting the logic element, and lines connecting the vertical transistors to each other.

The logic cell LC on the substrate 10 may include a first active area RX1 and a second active area RX2. For example, the first active area RX1 may be a PMOSFET area, and the second active area RX2 may be an NMOSFET area. Each of the first and second active areas RX1 and RX2 may be defined by a trench T_CH formed in an upper of the substrate 10. The first and second active areas RX1 and RX2 may be spaced apart from each other along the first direction D1.

A first lower epitaxial pattern SPO1 may be disposed on the first active area RX1, and a second lower epitaxial pattern SPO2 may be disposed on the second active area RX2. In a plan view, the first lower epitaxial pattern SPO1 may overlap the first active area RX1, and the second lower epitaxial pattern SPO2 may overlap the second active area RX2. Each of the first and second lower epitaxial patterns SPO1 and SPO2 may be formed via a selective epitaxial growth process. The first lower epitaxial pattern SPO1 may be disposed in a first recess area RS1 of the substrate 10, and the second lower epitaxial pattern SPO2 may be disposed in a second recess area RS2 of the substrate 10.

First active patterns AP1 may be disposed on the first active area RX1, and second active patterns AP2 may be disposed on the second active area RX2. Each of the first and second active patterns AP1 and AP2 may have a vertically protruding fin shape. In the plan view, each of the first and second active patterns AP1 and AP2 may have a bar shape extending in the first direction D2. The first active patterns AP1 may be arranged along the second direction D2, and the second active patterns AP2 may be arranged along the second direction D2.

Each of the first active patterns AP1 may include a first channel pattern CHP1 vertically protruding from the first lower epitaxial pattern SPO1 and a first upper epitaxial pattern DOP1 on the first channel pattern CHP1. Each of the second active patterns AP2 may include a second channel pattern CHP2 vertically protruding from the second lower epitaxial pattern SPO2 and a second upper epitaxial pattern DOP2 on the second channel pattern CHP2.

An element separation film ST may be disposed on substrate 10 so as to fill the trench T_CH. The element separator ST may cover upper surfaces of the first and second lower epitaxial patterns SPO1 and SPO2. The first and second active patterns AP1 and AP2 may protrude vertically and upwardly beyond the element separator ST.

A plurality of second gate electrodes 420 extending in a parallel manner to each other and in the first direction D1 may be disposed on the device isolation layer ST. The second gate electrodes 420 may be arranged along the second direction D2. The second gate electrode 420 may surround the first channel pattern CHP1 of the first active pattern AP1, and surround the second channel pattern CHP2 of the second active pattern AP2. For example, the first channel pattern CHP1 of the first active pattern AP1 may have first to fourth sidewalls SW1 to SW4. The first and second sidewalls SW1 and SW2 may face each other in the second direction D2, and the third and fourth sidewalls SW3 and SW4 may face each other in the first direction D1. The second gate electrode 420 may be disposed on the first to fourth sidewalls SW1 to SW4. For example, the second gate electrode 420 may surround the first to fourth sidewalls SW1 to SW4.

A second gate insulating film 430 may be interposed between the second gate electrode 420 and each of the first and second channel patterns CHP1 and CHP2. The second gate insulating film 430 may cover a bottom surface of the second gate electrode 420 and an inner sidewall of the second gate electrode 420. For example, the second gate insulating film 430 may directly cover the first to fourth sidewalls SW1 to SW4 of the first active pattern AP1.

The first and second upper epitaxial patterns DOP1 and DOP2 may protrude vertically and upwardly beyond the second gate electrode 420. A level of an upper surface of the second gate electrode 420 may be lower than that of a bottom surface of each of the first and second upper epitaxial patterns DOP1 and DOP2. For example, each of the first and second active patterns AP1 and AP2 may protrude vertically from the substrate 10 and extend through the second gate electrode 420.

The semiconductor device according to some example embodiments may include vertical transistors in which carriers move in the third direction D3. For example, when a voltage is applied to the second gate electrode 420 and thus the transistor is turned "on", the carriers may move from the lower epitaxial patterns SOP1 and SOP2 to the upper epitaxial patterns DOP1 and DOP2 via the channel patterns CHP1 and CHP2, respectively. In the semiconductor device according to some example embodiments, the second gate electrode 420 may surround an entirety of the sidewalls SW1 to SW4 of the channel patterns CHP1 and CHP2. The transistor according to the present disclosure may be embodied as a three-dimensional field effect transistor (for example, a VFET) having a gate all around structure. Because the gate surrounds the channel, the semiconductor device according to some example embodiments may have excellent electrical properties.

A spacer 440 covering the second gate electrodes 420 and the first and second active patterns AP1 and AP2 may be disposed on the device isolation layer ST. The spacer 440 may include a silicon nitride film or a silicon oxynitride film. The spacer 440 may include a lower spacer 440LS, an upper spacer 440US, and a gate spacer 440GS between the lower and upper spacers 440LS and 440US.

The lower spacer 440LS may directly cover an upper surface of the element separator ST. The second gate electrodes 420 may be spaced apart from the element separator ST along the third direction D3 via the lower spacer 440LS. The gate spacer 440GS may cover an upper surface and an outer sidewall of each of the second gate electrodes 420. The upper spacer 440 may cover the first and second upper epitaxial patterns DOP1 and DOP2. However, the upper spacer 440US may not cover upper surfaces of the first and second upper epitaxial patterns DOP1 and DOP2, but may expose upper surfaces of the first and second upper epitaxial patterns DOP1 and DOP2.

A first portion 190BP of the lower interlayer insulating film may be disposed on the spacer 440. An upper surface of the first portion 190BP of the lower interlayer insulating film may be substantially coplanar with each of the upper surfaces of the first and second upper epitaxial patterns DOP1 and DOP2. A second portion 190UP of the lower interlayer insulating film and the first and second interlayer insulating films 150 and 160 may be sequentially stacked on the first portion 190BP of the lower interlayer insulating film. The first portion 190BP of the lower interlayer insulating film and the second portion 190UP of the lower interlayer insulating film may be included in the lower interlayer insulating film 190. The second portion 190UP of the lower interlayer insulating film may cover the upper surfaces of the first and second upper epitaxial patterns DOP1 and DOP2.

At least one first source/drain contact 470 extending through the second portion 190UP of the lower interlayer insulating film, and connecting to the first and second upper epitaxial patterns DOP1 and DOP2 may be provided. At least one second source/drain contact 570 sequentially extending through the lower interlayer insulating film 190, the lower spacer 440LS and the element isolation film ST, and connecting to the first and second lower epitaxial patterns SPO1 and SPO2 may be provided. A gate contact 480 sequentially extending through the second portion 190UP of the lower interlayer insulating film, the first portion 190BP of the lower interlayer insulating film, and the gate spacer 440GS and connected to the second gate electrode 420 may be provided.

A third etch stop film 156 may be additionally disposed between the second portion 190UP of the lower interlayer insulating film and the first interlayer insulating film 150. The first etch stop film 155 may be disposed between the first interlayer insulating film 150 and the second interlayer insulating film 160.

The lower line structure 110 may be disposed in the first interlayer insulating film 150. The lower line structure 110 may include a lower via 110V and a lower wiring line 110L.

Description of the lower via 110V and the lower wiring line 110L may be similar to the description of the first upper via 210V1 and the first upper wiring line 210L. However, a film structure of the lower line structure 110 may be different from or the same as a film structure of the upper line structure 210.

The lower line structure 110 may be connected to the first source/drain contact 470, the second source/drain contact 570, and the gate contact 480. The first upper line structure 210 may be disposed in the second interlayer insulating film 160.

For example, an additional line structure similar to the first upper line structure 210 may be further disposed between the first source/drain contact 470 and the lower line structure 110.

Detailed description of the first upper line structure 210 may be substantially the same as that as described above with reference to FIG. 1 to FIG. 22.

FIG. 28 to FIG. 33 are diagrams of structures of intermediate operations for illustrating a method for manufacturing a semiconductor device according to some example embodiments.

For reference, FIG. 28, FIG. 30 to FIG. 33 are cross-sectional views taken along A-A of FIG. 1, respectively. FIG. 29 is a cross-sectional view taken along B-B of FIG. 1.

Figure 28:
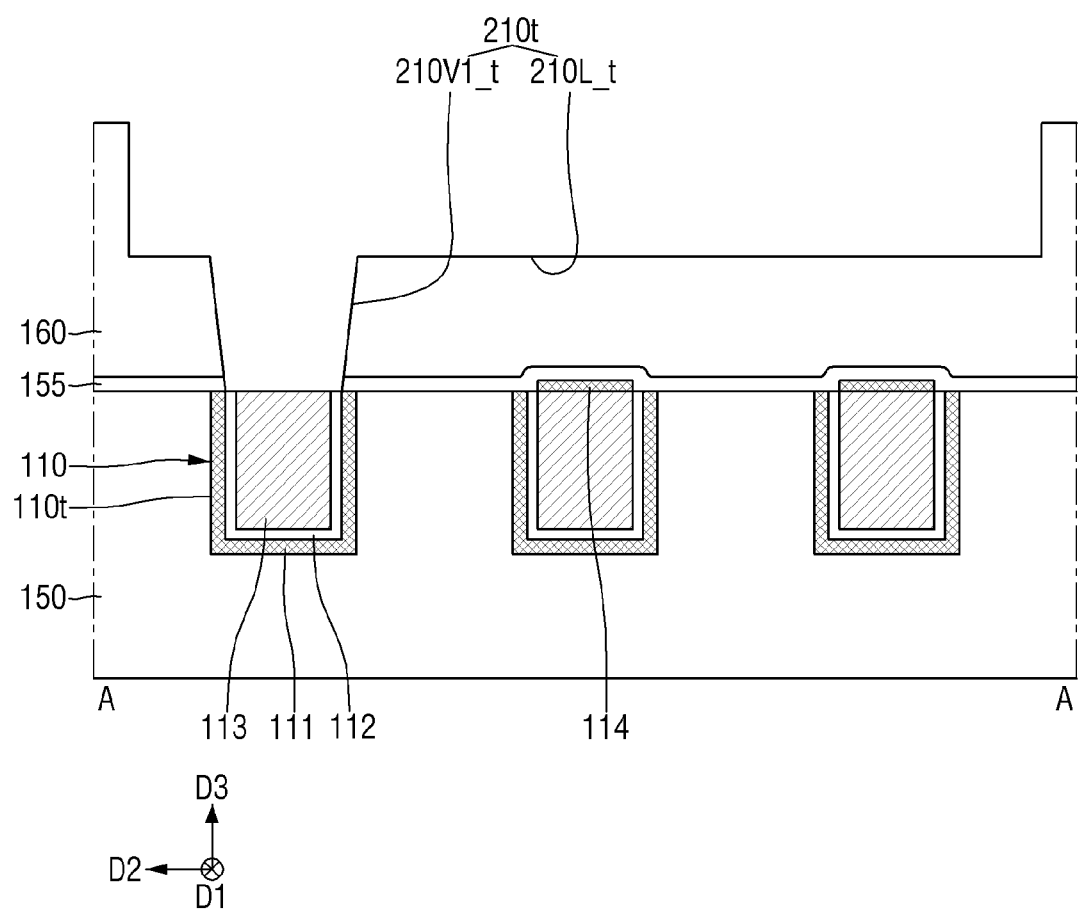
FIG. 28 to FIG. 33 are diagrams of structures of intermediate operations for illustrating a method for manufacturing a semiconductor device according to some example embodiments.
Figure 29:
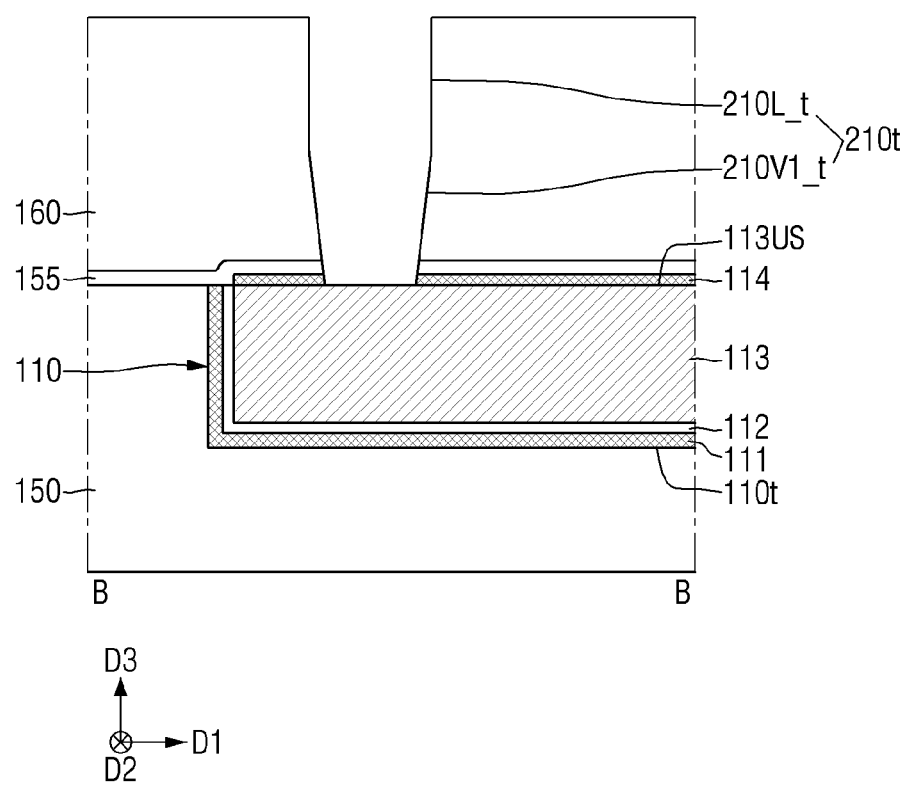

Referring to FIGS. 28 and 29, the lower line structure 110 may be formed in the first interlayer insulating film 150.

The lower line trench 110*t* may be formed in the first interlayer insulating film 150. In the lower line trench 110*t*, the lower line structure 110 may be formed. The lower line structure 110 may include the lower barrier film 111, the lower liner 112, the lower filling film 113, and the lower capping film 114.

Subsequently, the first etch stop film 155 may be formed on the first interlayer insulating film 150 and the lower line structure 110.

The second interlayer insulating film 160 may be formed on the first etch stop film 155. The second interlayer insulating film 160 may include the first upper line trench 210*t*. The first upper line trench 210*t* may include the first upper via trench 210V1_*t* and the first upper line trench 210L_t. The first upper via trench 210V1_*t* may expose the lower line structure 110.

The first upper line trench 210*t* may extend through the first etch stop film 155. In some embodiments, the first upper line trench 210*t* may extend through the lower capping film 114. In other embodiments, the upper line trench 210*t* may not extend through the lower capping film 114.

Figure 30:
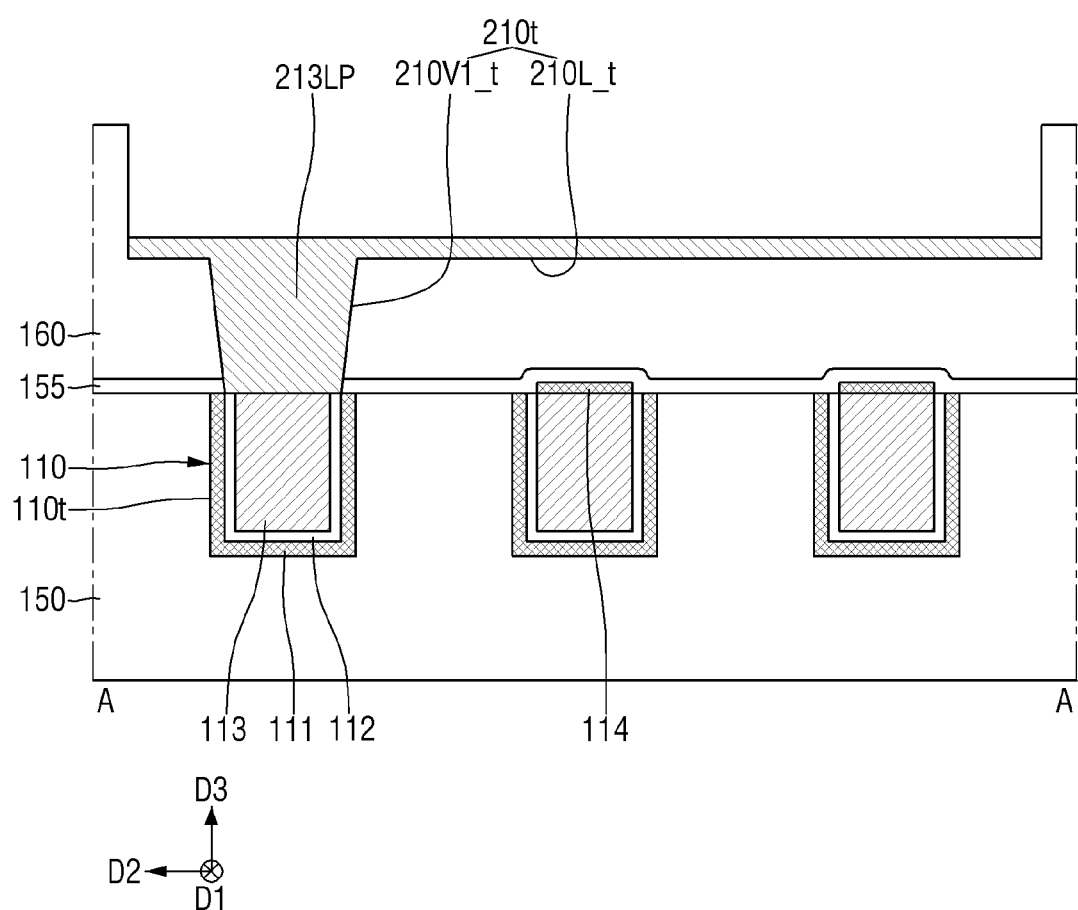

Referring to FIG. 30, on the lower line structure 110, the first sub-filling film 213LP filling an entirety of the upper via trench 210V1_*t* may be formed.

The first sub-filling film 213LP may cover at least a portion of a bottom surface of the first upper wiring line trench 210L_t. The first sub-filling film 213LP may fill a portion of the first upper wiring line trench 210L_t.

The first sub-filling film 213LP may be formed using a selective growth method. For example, an exposed surface of the conductive material may be used as a seed layer for the selective growth method.

Figure 31:
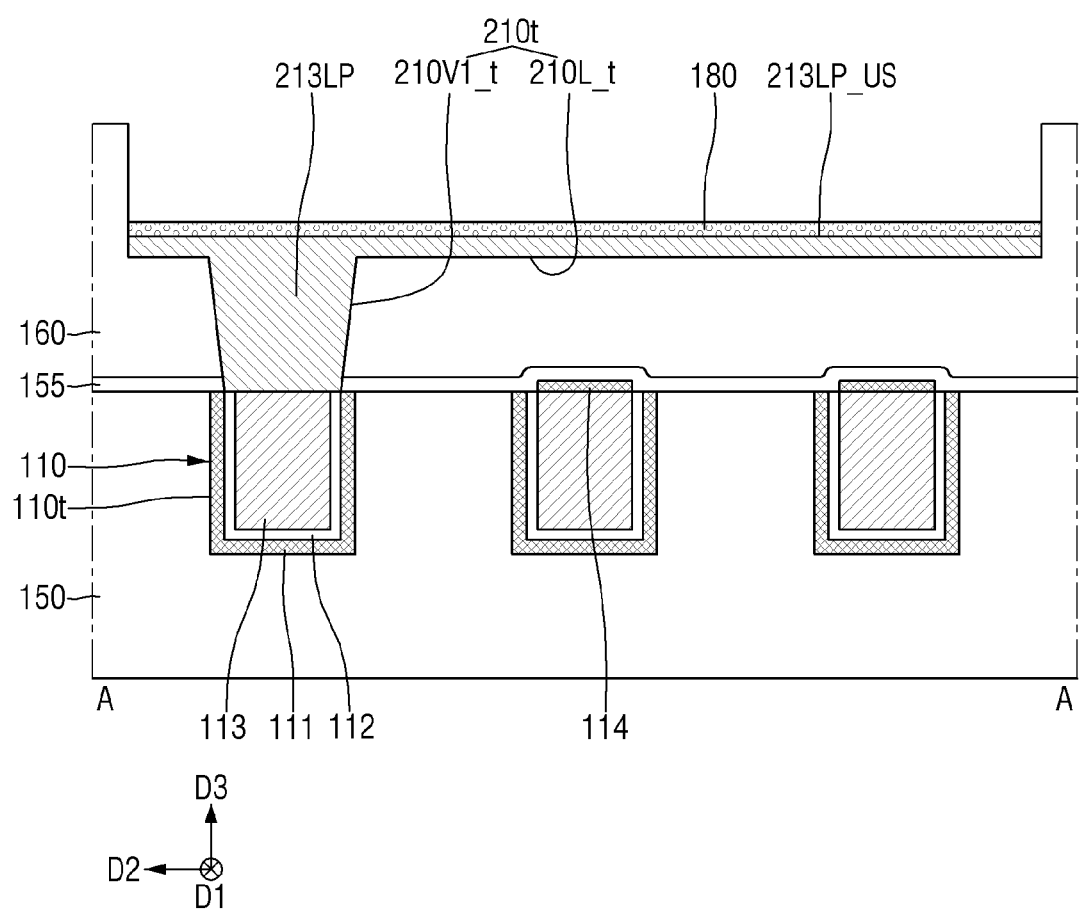

Referring to FIG. 31, a selective inhibiting film 180 may be formed along and on and on an upper surface 213LP_US of the first sub-filling film.

The selective inhibiting film 180 include an organic material. The selective inhibiting film 180 may selectively prevent deposition of a conductive material on a surface on which the selective inhibiting film 180 is formed.

The selective inhibiting film 180 may be formed on the conductive material. For example, the selective inhibiting film 180 may be formed on a metal or metal alloy (e.g., the first sub-filling film 213LP). The selective inhibiting film 180 may not be formed on the insulating material (e.g., the second interlayer insulating film 160).

Figure 32:
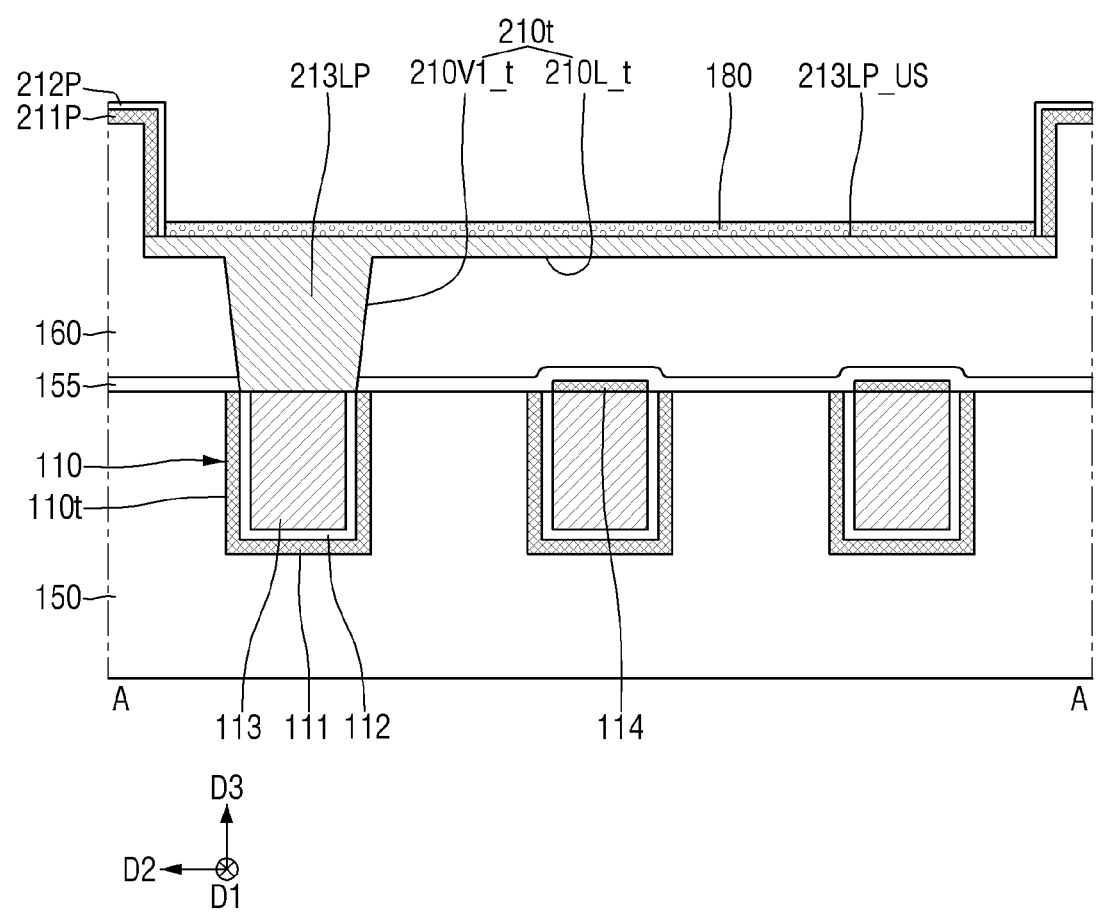

Referring to FIG. 32, in a state in which the selective inhibiting film 180 has been formed, a pre-upper bather film 211P is formed along and on and on a sidewall of the first upper line trench 210*t*. The pre-upper barrier film 211P may be formed along and on an upper surface of the second interlayer insulating film 160.

The pre-upper bather film 211P does not extend along and on an upper surface 213LP_US of the first sub-filling film.

The pre-upper barrier film 211P may be formed, for example, using Atomic Layer Deposition (ALD). However, the present disclosure is not limited thereto. The pre-upper barrier film 211P may include, but is not limited to, one of, for example, tantalum nitride (TaN) or tantalum nitride (TaN:Ru) doped with ruthenium.

Subsequently, in a state in which the selective inhibiting film 180 has been formed, a pre-upper liner 212P may be formed on the pre-upper bather film 211P. The pre-upper liner 212P may be formed along and on a sidewall of the first upper line trench 210*t* and an upper surface of the second interlayer insulating film 160. The pre-upper liner 212P may not extend along and on an upper surface 213LP_US of the first sub-filling film.

When the pre-upper liner 212P includes a plurality of films, a portion of the pre-upper liner 212P may extend along and on the upper surface 213LP_US of the first sub-filling film. For example, on a surface on which the selective inhibiting film 180 is formed, a conductive material A may not be deposited. To the contrary, on a surface on which the selective inhibiting film 180 is formed, a conductive material B may be deposited.

Figure 33:
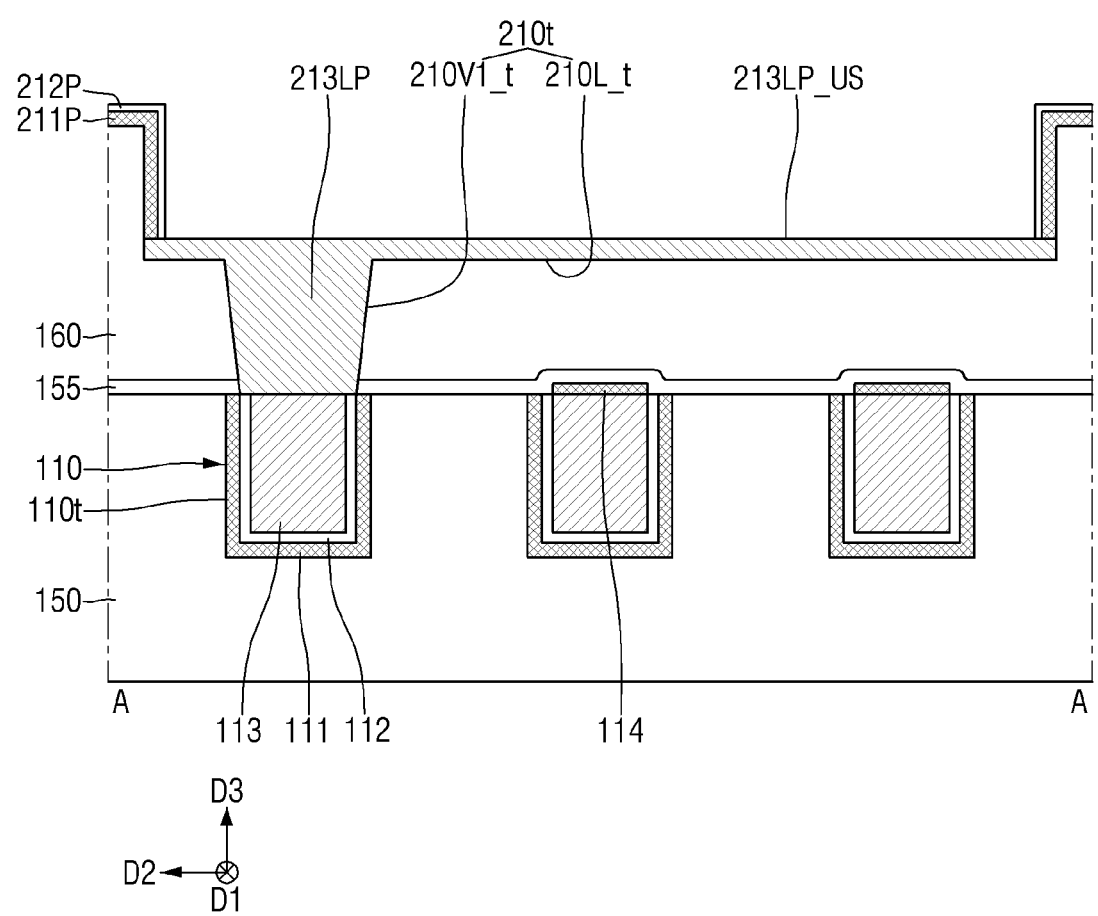

Referring to FIG. 33, the selective inhibiting film 180 may be removed such that the upper surface 213LP_US of the first sub-filling film may be exposed.

The selective inhibiting film 180 may be removed via, for example, but not limited to, plasma treatment.

Subsequently, a pre-sub-filling film may be formed on the first sub-filling film 213LP. The pre-sub-filling film may fill the remainder of the first upper line trench 210L_t. The pre-sub-filling film may be formed on an upper surface of the second interlayer insulating film 160.

The pre-upper barrier film 211P, the pre-upper liner 212P, and the pre-sub-filling film disposed on the upper surface of the second interlayer insulating film 160 may be removed. Accordingly, the first upper barrier film 211, the first upper liner 212, and the second sub-filling film 213UP may be formed on the first sub-filling film 213LP.

Figure 34:
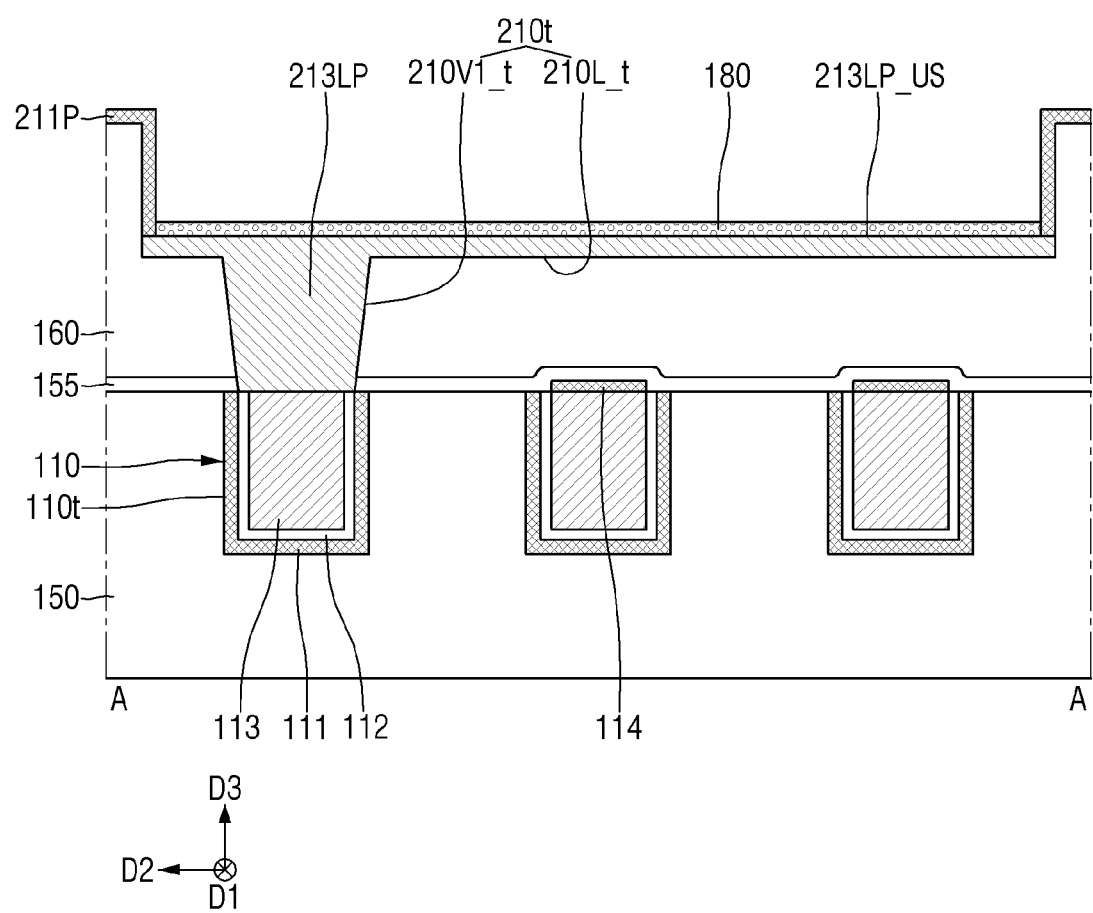
FIG. 34 to FIG. 36 are diagrams of structures of intermediate operations for illustrating a method for manufacturing a semiconductor device according to some example embodiments.
Figure 35:
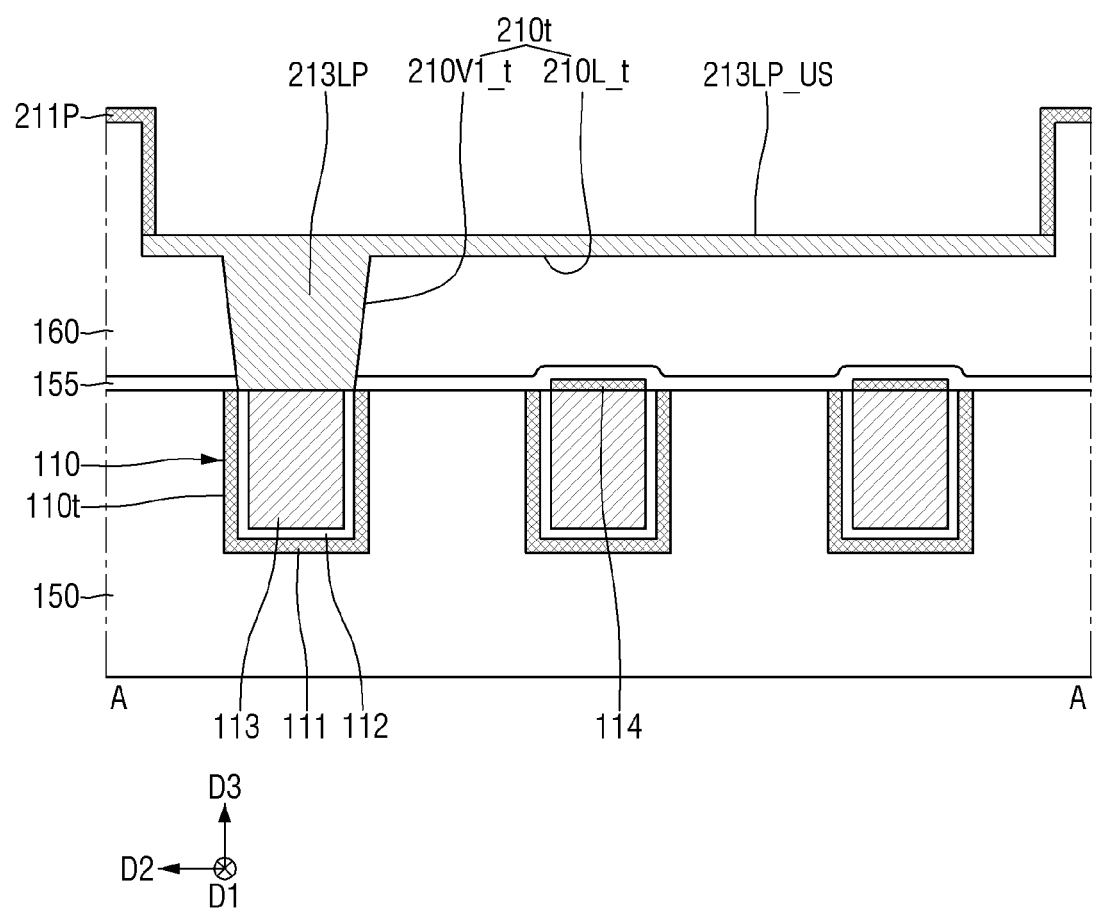
Figure 36:
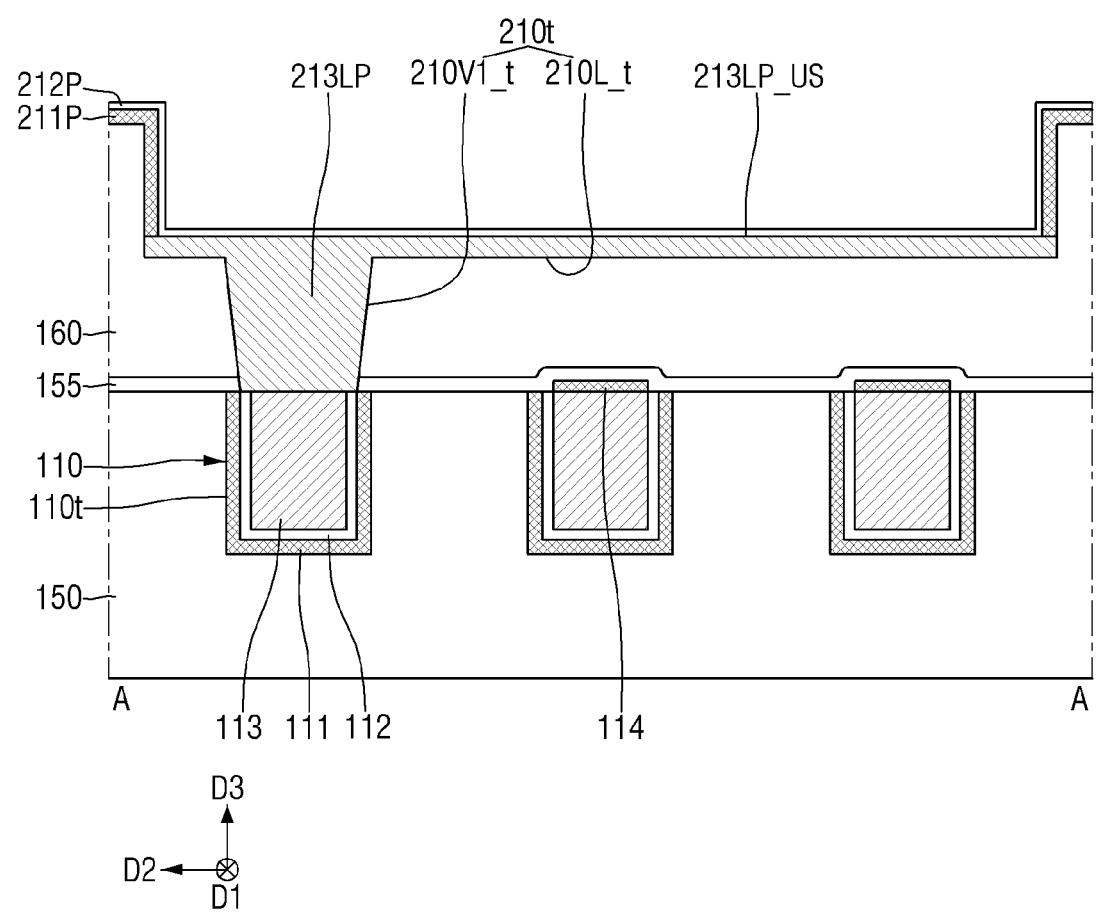

FIG. 34 to FIG. 36 are diagrams of structures of intermediate operations for illustrating a method for manufacturing a semiconductor device according to some example embodiments.

For reference, FIG. 34 may be directed to a process performed after FIG. 31. Further, FIG. 34 to FIG. 36 are cross-sectional views taken along A-A of FIG. 1, respectively.

Referring to FIG. 34, in a state in which the selective inhibiting film 180 has been formed, the pre-upper barrier film 211P may be formed along and on a sidewall of the first upper line trench 210*t* and an upper surface of the second interlayer insulating film 160.

Referring to FIG. 35, the selective inhibiting film 180 may be removed such that the upper surface 213LP_US of the first sub-filling film may be exposed.

Referring to FIG. 36, in a state in which the selective inhibiting film 180 has been removed, the pre-upper liner 212P may be formed on the pre-upper barrier film 211P.

The pre-upper liner 212P may be formed along and on a sidewall of the first upper line trench 210t and an upper surface of the second interlayer insulating film 160. The pre-upper liner 212P may extend along and on the upper surface 213LP_US of the first sub-filling film.

Subsequently, the pre-sub-filling film may be formed on the first sub-filling film 213LP. The pre-upper barrier film 211P, the pre-upper liner 212P, and the pre-sub-filling film disposed on the upper surface of the second interlayer insulating film 160 may be removed. The first upper barrier film 211, the first upper liner 212, and the second sub-filling film 213UP may be formed on the first sub-filling film 213LP.

While aspects of example embodiments have been particularly shown and described, it will be understood that various changes in form and details may be made therein without departing from the spirit and scope of the following claims.

What is claimed is:

1. A semiconductor device comprising:
a lower line structure;
an upper interlayer insulating film provided on the lower line structure and having an upper line trench formed therein, wherein the upper line trench comprises an upper wiring line trench and an upper via trench extending from the upper wiring line trench to the lower line structure; and
an upper line structure provided in the upper line trench, wherein the upper line structure comprises an upper barrier film and an upper filling film,
wherein the upper filling film comprises a first sub-filling film in contact with the upper interlayer insulating film, and a second sub-filling film provided on the first sub-filling film,
wherein the first sub-filling film is a single film which fills an entirety of the upper via trench, covers at least a portion of a bottom surface of the upper wiring line trench, and extends between the upper interlayer insulating film and the upper barrier film to a sidewall of the upper line trench, and
wherein the upper barrier film is in contact with the upper interlayer insulating film, and is provided between the second sub-filling film and the upper interlayer insulating film.

2. The semiconductor device of claim 1, wherein the upper barrier film extends along and on at least a portion of the sidewall of the upper wiring line trench.

3. The semiconductor device of claim 2, wherein the bottom surface of the upper wiring line trench comprises a first area and a second area,
wherein the first sub-filling film covers the first area of the bottom surface of the upper wiring line trench, and
wherein the upper barrier film covers the second area of the bottom surface of the upper wiring line trench.

4. The semiconductor device of claim 1, wherein the first sub-filling film covers an entirety of the bottom surface of the upper wiring line trench.

5. The semiconductor device of claim 1, wherein an upper surface of the first sub-filling film and a bottom surface of the second sub-filling film are in contact with each other.

6. The semiconductor device of claim 1, further comprising an upper liner provided between the upper barrier film and the second sub-filling film.

7. The semiconductor device of claim 6, wherein the upper liner comprises a first sub-liner and a second sub-liner sequentially provided on the upper barrier film, and
wherein each of the first sub-liner and the second sub-liner extends along a bottom surface of the second sub-filling film.

8. The semiconductor device of claim 6, wherein the upper liner comprises a first sub-liner and a second sub-liner sequentially provided on the upper barrier film,
wherein the first sub-liner does not extend along and on a bottom surface of the second sub-filling film,
wherein the second sub-liner extends along and on the bottom surface of the second sub-filling film.

9. The semiconductor device of claim 6, wherein the upper liner comprises any one or any combination of cobalt (Co) and ruthenium (Ru).

10. The semiconductor device of claim 1, wherein the first sub-filling film and the second sub-filling film comprise different materials.

11. The semiconductor device of claim 1, wherein the lower line structure comprises a lower filling film and a lower capping film provided on the lower filling film, and
wherein the first sub-filling film is in contact with an upper surface of the lower capping film.

12. The semiconductor device of claim 1, wherein the lower line structure comprises a lower filling film and a lower capping film provided on the lower filling film,
wherein an upper surface of the lower filling film comprises a first area on which the lower capping film is provided, and a second area on which the lower capping film is not provided, and
wherein the upper line structure is in contact with the second area.

13. A semiconductor device comprising:
a lower line structure;
an upper interlayer insulating film provided on the lower line structure and having an upper line trench formed therein, wherein the upper line trench comprises an upper wiring line trench and an upper via trench extending from the upper wiring line trench to the lower line structure; and
an upper line structure is provided in the upper line trench, wherein the upper line structure comprises an upper barrier film and an upper filling film,
wherein the upper filling film comprises a first sub-filling film, and a second sub-filling film provided on the first sub-filling film,
wherein the first sub-filling film is a single film which fills an entirety of the upper via trench, covers at least a portion of a bottom surface of the upper wiring line trench, and extends between the upper interlayer insulating film and the upper barrier film to a sidewall of the upper line trench, and
wherein the upper barrier film extends along and on at least a portion of the sidewall of the upper wiring line trench, and the second sub-filling film is provided between portions of the upper barrier film on an upper surface of the first sub-filling film.

14. The semiconductor device of claim 13, wherein the upper barrier film is in contact with the upper interlayer insulating film and extends along a portion of the sidewall of the upper wiring line trench.

15. The semiconductor device of claim 13, wherein the first sub-filling film and the second sub-filling film are in contact with each other.

16. The semiconductor device of claim 13, further comprising a first upper liner and a second upper liner provided between the upper barrier film and the second sub-filling film,
wherein at least one of the first upper liner and the second upper liner extends along a bottom surface of the second sub-filling film.

17. The semiconductor device of claim 13 further comprising an upper liner provided between the upper barrier film and the second sub-filling film,
wherein a bottom surface of the second sub-filling film extends between portions of the upper liner.

18. A semiconductor device comprising:
a lower line structure;
an upper interlayer insulating film provided on the lower line structure and having an upper line trench formed therein, wherein the upper line trench comprises an upper wiring line trench and an upper via trench extending from the upper wiring line trench to the lower line structure; and
an upper line structure provided in the upper line trench, wherein the upper line structure comprises an upper barrier film, an upper liner, and an upper filling film,
wherein the upper filling film comprises a first sub-filling film and a second sub-filling film provided on the first sub-filling film,
wherein the first sub-filling film is a single film which fills an entirety of the upper via trench and a portion of the upper wiring line trench, and extends between the upper interlayer insulating film and the upper barrier film to a sidewall of the upper line trench,
wherein the upper barrier film is in contact with the upper interlayer insulating film and extends along and on a portion of the sidewall of the upper wiring line trench, and
wherein the upper liner is provided between the upper barrier film and the second sub-filling film.

19. The semiconductor device of claim 18, wherein the first sub-filling film and the second sub-filling film are in contact with each other.

20. The semiconductor device of claim 18, wherein the upper liner extends along a bottom surface of the second sub-filling film.

* * * * *